US012585184B2

(12) United States Patent
Weidman et al.

(10) Patent No.: US 12,585,184 B2
(45) Date of Patent: Mar. 24, 2026

(54) PHOTORESIST WITH MULTIPLE PATTERNING RADIATION-ABSORBING ELEMENTS AND/OR VERTICAL COMPOSITION GRADIENT

(71) Applicant: Lam Research Corporation, Fremont, CA (US)

(72) Inventors: Timothy William Weidman, Sunnyvale, CA (US); Kevin Li Gu, Sunnyvale, CA (US); Katie Lynn Nardi, San Jose, CA (US); Chenghao Wu, Berkeley, CA (US); Boris Volosskiy, San Jose, CA (US); Eric Calvin Hansen, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 753 days.

(21) Appl. No.: 17/596,722

(22) PCT Filed: Jun. 24, 2020

(86) PCT No.: PCT/US2020/070172
§ 371 (c)(1),
(2) Date: Dec. 16, 2021

(87) PCT Pub. No.: WO2020/264557
PCT Pub. Date: Dec. 30, 2020

(65) Prior Publication Data
US 2022/0342301 A1 Oct. 27, 2022

Related U.S. Application Data

(60) Provisional application No. 62/868,710, filed on Jun. 28, 2019.

(51) Int. Cl.
| | |
|---|---|
| *G03F 7/004* | (2006.01) |
| *G03F 7/00* | (2006.01) |
| *G03F 7/16* | (2006.01) |

(52) U.S. Cl.
CPC .......... *G03F 7/0043* (2013.01); *G03F 7/0042* (2013.01); *G03F 7/167* (2013.01); *G03F 7/70033* (2013.01)

(58) Field of Classification Search
None
See application file for complete search history.

(56) References Cited

U.S. PATENT DOCUMENTS

| | | | |
|---|---|---|---|
| 3,513,010 A | 5/1970 | Notley et al. | |
| 3,529,963 A | 9/1970 | Marchese et al. | |
| (Continued) | | | |

FOREIGN PATENT DOCUMENTS

| | | |
|---|---|---|
| CN | 101098575 A | 1/2008 |
| CN | 102610516 A | 7/2012 |
| (Continued) | | |

OTHER PUBLICATIONS

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
(Continued)

*Primary Examiner* — Jonathan Johnson
*Assistant Examiner* — Andrew Preston Traywick
(74) *Attorney, Agent, or Firm* — Weaver Austin Villeneuve & Sampson LLP

(57) ABSTRACT

Various embodiments herein relate to techniques for depositing photoresist material on a substrate. For example, the tin techniques may involve providing the substrate in a reaction chamber; providing a first and second reactant to the reaction chamber, where the first reactant is an organo-metallic
(Continued)

Composition of Representative Films

Absorption of Light with Film Depth precursor having a formula of $M1_aR1_bL1_c$, where: M1 is a metal having a high patterning radiation-absorption cross-section, R1 is an organic group that survives the reaction between the first reactant and the second reactant and is cleavable from M1 under exposure to patterning radiation, L1 is a ligand, ion, or other moiety that reacts with the second reactant, $a \geq 1$, $b \geq 1$, and $c \geq 1$, and where at least one of the following conditions is satisfied: the photoresist material comprises two or more high-patterning radiation absorbing elements, and/or the photoresist material comprises a composition gradient along a thickness of the photoresist material.

20 Claims, 8 Drawing Sheets

(56)                References Cited

U.S. PATENT DOCUMENTS

| | | | |
|---|---|---|---|
| 3,576,755 A | 4/1971 | Patella et al. | |
| 3,720,515 A | 3/1973 | Stanley | |
| 4,241,165 A | 12/1980 | Hughes et al. | |
| 4,328,298 A | 5/1982 | Nester | |
| 4,590,149 A | 5/1986 | Nakane et al. | |
| 4,834,834 A | 5/1989 | Ehrlich et al. | |
| 4,842,989 A | 6/1989 | Taniguchi et al. | |
| 4,845,053 A | 7/1989 | Zajac | |
| 4,940,854 A | 7/1990 | Debe | |
| 4,956,204 A | 9/1990 | Amazawa et al. | |
| 5,077,085 A | 12/1991 | Schnur et al. | |
| 5,079,600 A | 1/1992 | Schnur et al. | |
| 5,322,765 A | 6/1994 | Clecak et al. | |
| 5,399,464 A | 3/1995 | Lee | |
| 5,534,312 A | 7/1996 | Hill et al. | |
| 5,761,023 A | 6/1998 | Lue et al. | |
| 6,017,553 A | 1/2000 | Burrell et al. | |
| 6,045,877 A | 4/2000 | Gleason et al. | |
| 6,162,577 A | 12/2000 | Felter et al. | |
| 6,261,938 B1 | 7/2001 | Beauvais et al. | |
| 6,290,779 B1 | 9/2001 | Saleh et al. | |
| 6,348,239 B1 | 2/2002 | Hill et al. | |
| 6,410,421 B1 | 6/2002 | Ghandehari et al. | |
| 6,607,867 B1 | 8/2003 | Kim et al. | |
| 6,797,439 B1 | 9/2004 | Alpay | |
| 6,833,306 B2 | 12/2004 | Lyding et al. | |
| 7,307,695 B2 | 12/2007 | Hazenberg et al. | |
| 8,383,316 B2 | 2/2013 | Cooper et al. | |
| 8,465,903 B2 | 6/2013 | Weidman et al. | |
| 8,536,068 B2 | 9/2013 | Weidman et al. | |
| 8,664,124 B2 | 3/2014 | Graff | |
| 8,664,513 B2 | 3/2014 | Pfenninger et al. | |
| 8,703,386 B2 | 4/2014 | Bass et al. | |
| 9,023,731 B2 | 5/2015 | Ji et al. | |
| 9,261,784 B2 | 2/2016 | Wuister et al. | |
| 9,310,684 B2 | 4/2016 | Meyers et al. | |
| 9,551,924 B2 | 1/2017 | Burkhardt et al. | |
| 9,632,411 B2 | 4/2017 | Michaelson et al. | |
| 9,719,169 B2 | 8/2017 | Mohn et al. | |
| 9,778,561 B2 | 10/2017 | Marks et al. | |
| 9,823,564 B2 | 11/2017 | Stowers et al. | |
| 9,996,004 B2 * | 6/2018 | Smith | G03F 7/167 |
| 10,025,179 B2 | 7/2018 | Meyers et al. | |
| 10,228,618 B2 | 3/2019 | Meyers et al. | |
| 10,416,554 B2 | 9/2019 | Meyers et al. | |
| 10,514,598 B2 | 12/2019 | Marks et al. | |
| 10,580,585 B2 | 3/2020 | Snaith et al. | |
| 10,627,719 B2 | 4/2020 | Waller et al. | |
| 10,642,153 B2 | 5/2020 | Meyers et al. | |
| 10,649,328 B2 | 5/2020 | Stowers et al. | |
| 10,732,505 B1 | 8/2020 | Meyers et al. | |
| 10,775,696 B2 | 9/2020 | Meyers et al. | |
| 10,782,610 B2 | 9/2020 | Stowers et al. | |
| 10,787,466 B2 | 9/2020 | Edson et al. | |
| 10,831,096 B2 | 11/2020 | Marks et al. | |
| 11,209,729 B2 | 12/2021 | Marks et al. | |
| 11,358,975 B2 | 6/2022 | Ermert et al. | |
| 11,921,427 B2 | 3/2024 | Weidman et al. | |
| 2002/0015855 A1 | 2/2002 | Sajoto et al. | |
| 2002/0017243 A1 | 2/2002 | Pyo | |
| 2002/0018855 A1 | 2/2002 | Damrau | |
| 2002/0123221 A1 | 9/2002 | Jost et al. | |
| 2002/0180372 A1 | 12/2002 | Yamazaki | |
| 2003/0008246 A1 | 1/2003 | Cheng et al. | |
| 2003/0183244 A1 | 10/2003 | Rossman | |
| 2004/0113087 A1 | 6/2004 | Ikeda et al. | |
| 2004/0175631 A1 | 9/2004 | Crocker et al. | |
| 2004/0191423 A1 | 9/2004 | Ruan et al. | |
| 2004/0203256 A1 | 10/2004 | Yang et al. | |
| 2004/0213563 A1 | 10/2004 | Irie | |
| 2005/0120955 A1 | 6/2005 | Yamasaki et al. | |
| 2005/0167617 A1 | 8/2005 | Derra et al. | |
| 2005/0208389 A1 | 9/2005 | Ishibashi et al. | |
| 2005/0253077 A1 | 11/2005 | Ikeda et al. | |
| 2005/0257747 A1 | 11/2005 | Wakabayashi et al. | |
| 2006/0001064 A1 | 1/2006 | Hill et al. | |
| 2006/0068173 A1 | 3/2006 | Kajiyama et al. | |
| 2006/0128127 A1 | 6/2006 | Seo et al. | |
| 2006/0147818 A1 | 7/2006 | Lee | |
| 2006/0151462 A1 | 7/2006 | Lee et al. | |
| 2006/0175558 A1 | 8/2006 | Bakker et al. | |
| 2007/0074541 A1 | 4/2007 | Badding et al. | |
| 2007/0181816 A1 | 8/2007 | Ikeda et al. | |
| 2008/0131616 A1 | 6/2008 | Besson et al. | |
| 2008/0157011 A1 | 7/2008 | Nagai et al. | |
| 2009/0130859 A1 | 5/2009 | Itatani et al. | |
| 2009/0153826 A1 | 6/2009 | Sewell et al. | |
| 2009/0208880 A1 | 8/2009 | Nemani et al. | |
| 2009/0239155 A1 | 9/2009 | Levinson et al. | |
| 2009/0305174 A1 | 12/2009 | Shiobara et al. | |
| 2009/0325387 A1 | 12/2009 | Chen et al. | |
| 2010/0099267 A1 | 4/2010 | Wang et al. | |
| 2010/0131093 A1 | 5/2010 | Yokoyama et al. | |
| 2010/0197135 A1 | 8/2010 | Ishizaka | |
| 2010/0266969 A1 | 10/2010 | Shiraishi et al. | |
| 2010/0304027 A1 | 12/2010 | Lee et al. | |
| 2011/0104595 A1 | 5/2011 | Hayashi et al. | |
| 2011/0117702 A1 | 5/2011 | Rietzler et al. | |
| 2011/0198756 A1 | 8/2011 | Thenappan et al. | |
| 2011/0209725 A1 | 9/2011 | Kim et al. | |
| 2011/0244681 A1 | 10/2011 | Blasco et al. | |
| 2012/0024388 A1 | 2/2012 | Burrows et al. | |
| 2012/0088193 A1 | 4/2012 | Weidman et al. | |
| 2012/0088369 A1 | 4/2012 | Weidman et al. | |
| 2012/0161405 A1 | 6/2012 | Mohn et al. | |
| 2012/0183689 A1 | 7/2012 | Suzuki et al. | |
| 2012/0202357 A1 | 8/2012 | Sato et al. | |
| 2012/0208125 A1 | 8/2012 | Hatakeyama | |
| 2012/0223418 A1 | 9/2012 | Stowers et al. | |
| 2012/0322011 A1 | 12/2012 | Wu et al. | |
| 2013/0129995 A1 | 5/2013 | Ouattara et al. | |
| 2013/0157177 A1 | 6/2013 | Yu et al. | |
| 2013/0164691 A1 | 6/2013 | Shiobara | |
| 2013/0224652 A1 | 8/2013 | Bass et al. | |
| 2013/0273733 A1 | 10/2013 | Tang et al. | |
| 2014/0014745 A1 | 1/2014 | Burrows et al. | |
| 2014/0170563 A1 | 6/2014 | Hatakeyama | |
| 2014/0170853 A1 | 6/2014 | Shamma et al. | |
| 2014/0209015 A1 | 7/2014 | Yamada et al. | |
| 2014/0239462 A1 | 8/2014 | Shamma et al. | |
| 2014/0268082 A1 | 9/2014 | Michaelson et al. | |
| 2014/0272726 A1 | 9/2014 | Chang | |
| 2015/0056542 A1 | 2/2015 | Meyers et al. | |
| 2015/0079393 A1 | 3/2015 | Freedman et al. | |
| 2015/0096494 A1 | 4/2015 | Nishiura et al. | |
| 2015/0125679 A1 | 5/2015 | Ishikawa | |
| 2015/0152551 A1 | 6/2015 | Yamaguchi et al. | |
| 2015/0167170 A1 * | 6/2015 | Ranade | C23C 16/04 |
| | | | 118/723 R |
| 2015/0194343 A1 | 7/2015 | Chi et al. | |
| 2015/0221519 A1 | 8/2015 | Marks et al. | |
| 2015/0303064 A1 | 10/2015 | Singer et al. | |
| 2016/0011505 A1 | 1/2016 | Stowers et al. | |

(56) References Cited

U.S. PATENT DOCUMENTS

| | | | |
|---|---|---|---|
| 2016/0011516 A1 | 1/2016 | Devilliers | |
| 2016/0035631 A1 | 2/2016 | Lee et al. | |
| 2016/0116839 A1 | 4/2016 | Meyers et al. | |
| 2016/0216606 A1 | 7/2016 | Meyers et al. | |
| 2016/0284559 A1 | 9/2016 | Kikuchi et al. | |
| 2016/0357103 A1 | 12/2016 | Nagahara et al. | |
| 2016/0357107 A1 | 12/2016 | Buchberger, Jr. et al. | |
| 2017/0068174 A1* | 3/2017 | Michaelson | G03F 7/70716 |
| 2017/0102612 A1* | 4/2017 | Meyers | G03F 7/168 |
| 2017/0146909 A1 | 5/2017 | Smith et al. | |
| 2017/0154766 A1 | 6/2017 | Ogihara et al. | |
| 2017/0167024 A1 | 6/2017 | Wiltse et al. | |
| 2017/0168398 A1 | 6/2017 | Zi et al. | |
| 2017/0176858 A1 | 6/2017 | Hirano | |
| 2017/0184961 A1 | 6/2017 | Nakagawa et al. | |
| 2017/0261850 A1 | 9/2017 | Stowers et al. | |
| 2017/0330787 A1 | 11/2017 | Mitsunaga et al. | |
| 2018/0004083 A1 | 1/2018 | Marks et al. | |
| 2018/0012759 A1 | 1/2018 | Smith et al. | |
| 2018/0039172 A1 | 2/2018 | Stowers et al. | |
| 2018/0046086 A1 | 2/2018 | Waller et al. | |
| 2018/0122648 A1 | 5/2018 | Kim et al. | |
| 2018/0166278 A1 | 6/2018 | Belyansky et al. | |
| 2018/0224744 A1 | 8/2018 | Bae et al. | |
| 2018/0233362 A1 | 8/2018 | Glodde et al. | |
| 2018/0233398 A1 | 8/2018 | Van Cleemput et al. | |
| 2018/0294155 A1 | 10/2018 | Soppera et al. | |
| 2018/0307137 A1 | 10/2018 | Meyers et al. | |
| 2018/0308687 A1 | 10/2018 | Smith et al. | |
| 2018/0314167 A1 | 11/2018 | Chang et al. | |
| 2018/0337243 A1 | 11/2018 | Li et al. | |
| 2019/0056914 A1 | 2/2019 | Ma et al. | |
| 2019/0088521 A1 | 3/2019 | Chua et al. | |
| 2019/0094685 A1 | 3/2019 | Marks et al. | |
| 2019/0129307 A1 | 5/2019 | Kwon et al. | |
| 2019/0137870 A1* | 5/2019 | Meyers | G03F 7/168 |
| 2019/0153001 A1 | 5/2019 | Cardineau et al. | |
| 2019/0163056 A1 | 5/2019 | Maes et al. | |
| 2019/0172714 A1 | 6/2019 | Bobek et al. | |
| 2019/0258160 A1 | 8/2019 | Satoh et al. | |
| 2019/0308998 A1 | 10/2019 | Cardineau et al. | |
| 2019/0315781 A1 | 10/2019 | Edson et al. | |
| 2019/0315782 A1 | 10/2019 | Edson et al. | |
| 2019/0348292 A1 | 11/2019 | Dutta et al. | |
| 2019/0369489 A1 | 12/2019 | Meyers et al. | |
| 2019/0382890 A1* | 12/2019 | Lerner | C23C 16/45565 |
| 2019/0391486 A1 | 12/2019 | Jiang et al. | |
| 2020/0064733 A1 | 2/2020 | Meyers et al. | |
| 2020/0089104 A1 | 3/2020 | Marks et al. | |
| 2020/0096870 A1 | 3/2020 | Ma et al. | |
| 2020/0124970 A1 | 4/2020 | Kocsis et al. | |
| 2020/0133131 A1 | 4/2020 | Ouyang | |
| 2020/0157683 A1 | 5/2020 | Kato et al. | |
| 2020/0176246 A1 | 6/2020 | Huotari et al. | |
| 2020/0209756 A1 | 7/2020 | Waller et al. | |
| 2020/0239498 A1 | 7/2020 | Clark et al. | |
| 2020/0241413 A1 | 7/2020 | Clark et al. | |
| 2020/0257196 A1 | 8/2020 | Meyers et al. | |
| 2020/0292937 A1 | 9/2020 | Stowers et al. | |
| 2021/0013034 A1 | 1/2021 | Wu et al. | |
| 2021/0397085 A1 | 12/2021 | Weidman et al. | |
| 2022/0020584 A1 | 1/2022 | Volosskiy et al. | |
| 2022/0035247 A1 | 2/2022 | Tan et al. | |
| 2022/0043334 A1 | 2/2022 | Tan et al. | |
| 2022/0075260 A1 | 3/2022 | Marks et al. | |
| 2022/0308462 A1 | 9/2022 | Berney et al. | |
| 2022/0365434 A1 | 11/2022 | Nardi et al. | |
| 2023/0107357 A1 | 4/2023 | Dictus et al. | |
| 2023/0259025 A1 | 8/2023 | Hansen et al. | |
| 2023/0266662 A1 | 8/2023 | Marks et al. | |
| 2023/0266664 A1 | 8/2023 | Hansen et al. | |
| 2023/0273516 A1 | 8/2023 | Marks et al. | |
| 2023/0288798 A1 | 9/2023 | Hansen et al. | |
| 2023/0314946 A1 | 10/2023 | Hansen et al. | |
| 2024/0192590 A1 | 6/2024 | Kanakasabapathy et al. | |
| 2024/0231224 A9 | 7/2024 | Weidman et al. | |
| 2024/0302739 A1 | 9/2024 | Kanakasabapathy et al. | |
| 2025/0053080 A1 | 2/2025 | Marks et al. | |
| 2025/0201553 A1 | 6/2025 | Wu et al. | |
| 2025/0291253 A1 | 9/2025 | Berney et al. | |
| 2025/0346767 A1 | 11/2025 | Vrtis et al. | |

FOREIGN PATENT DOCUMENTS

| | | |
|---|---|---|
| CN | 105047541 A | 11/2015 |
| CN | 106558477 A | 4/2017 |
| CN | 108351594 A | 7/2018 |
| CN | 109154777 A | 1/2019 |
| CN | 111258190 A | 6/2020 |
| CN | 113039486 A | 6/2021 |
| EP | 3230294 A1 | 10/2017 |
| EP | 3451059 A1 | 3/2019 |
| JP | S6347364 A | 2/1988 |
| JP | H01220829 A | 9/1989 |
| JP | H04284620 A | 10/1992 |
| JP | H07106224 A | 4/1995 |
| JP | 2001203170 A | 7/2001 |
| JP | 2001235875 A | 8/2001 |
| JP | 2002030445 A | 1/2002 |
| JP | 2002231603 A | 8/2002 |
| JP | 2003213001 A | 7/2003 |
| JP | 2003532303 A | 10/2003 |
| JP | 2004006798 A | 1/2004 |
| JP | 2005504146 A | 2/2005 |
| JP | 2006253282 A | 9/2006 |
| JP | 2007114255 A | 5/2007 |
| JP | 2008091215 A | 4/2008 |
| JP | 2011520242 A | 7/2011 |
| JP | 2011253185 A | 12/2011 |
| JP | 2011529126 A | 12/2011 |
| JP | 2012185485 A | 9/2012 |
| JP | 2013135066 A | 7/2013 |
| JP | 2014512458 A | 5/2014 |
| JP | 2014146767 A | 8/2014 |
| JP | 2014521111 A | 8/2014 |
| JP | 2014159625 A | 9/2014 |
| JP | 2015513540 A | 5/2015 |
| JP | 2015105405 A | 6/2015 |
| JP | 2015108781 A | 6/2015 |
| JP | 2015201622 A | 11/2015 |
| JP | 2016037656 A | 3/2016 |
| JP | 2016517633 A | 6/2016 |
| JP | 2016529330 A | 9/2016 |
| JP | 2017014602 A | 1/2017 |
| JP | 2017016069 A | 1/2017 |
| JP | 2017500448 A | 1/2017 |
| JP | 2017116923 A | 6/2017 |
| JP | 2017208374 A | 11/2017 |
| JP | 2017228596 A | 12/2017 |
| JP | 2018006742 A | 1/2018 |
| JP | 2018502173 A | 1/2018 |
| JP | 2018017780 A | 2/2018 |
| JP | 2018518688 A | 7/2018 |
| JP | 2019500490 A | 1/2019 |
| JP | 2019095794 A | 6/2019 |
| JP | 2020021071 A | 2/2020 |
| JP | 2021523403 A | 9/2021 |
| JP | 2021528676 A | 10/2021 |
| KR | 910001190 B1 | 2/1991 |
| KR | 920016947 A | 9/1992 |
| KR | 20060066602 A | 6/2006 |
| KR | 20090042059 A | 4/2009 |
| KR | 20110132288 A | 12/2011 |
| KR | 20130093038 A | 8/2013 |
| KR | 20140047120 A | 4/2014 |
| KR | 20140106442 A | 9/2014 |
| KR | 20150008065 A | 1/2015 |
| KR | 20150129781 A | 11/2015 |
| KR | 20170000361 A | 1/2017 |
| KR | 20170066225 A | 6/2017 |
| KR | 20180054917 A | 5/2018 |
| KR | 20190003528 A | 1/2019 |
| KR | 20190060678 A | 6/2019 |
| KR | 20190074018 A | 6/2019 |

(56) References Cited

FOREIGN PATENT DOCUMENTS

| | | |
|---|---|---|
| KR | 20190134327 A | 12/2019 |
| KR | 20190139594 A | 12/2019 |
| KR | 20200022046 A | 3/2020 |
| KR | 20200079731 A | 7/2020 |
| KR | 20200144580 A | 12/2020 |
| KR | 20210128796 A | 10/2021 |
| TW | 201222144 A | 6/2012 |
| TW | 201224190 A | 6/2012 |
| TW | 201241555 A | 10/2012 |
| TW | 201305736 A | 2/2013 |
| TW | 201330093 A | 7/2013 |
| TW | 201430164 A | 8/2014 |
| TW | 201502696 A | 1/2015 |
| TW | 201539538 A | 10/2015 |
| TW | 201721711 A | 6/2017 |
| TW | 201729006 A | 8/2017 |
| TW | 201734025 A | 10/2017 |
| TW | 201811876 A | 4/2018 |
| TW | 201835226 A | 10/2018 |
| TW | 201903191 A | 1/2019 |
| TW | 201930323 A | 8/2019 |
| TW | 202006168 A | 2/2020 |
| WO | WO-03029015 A2 | 4/2003 |
| WO | WO-2004007797 A1 | 1/2004 |
| WO | WO-2004095551 A1 | 11/2004 |
| WO | WO-2007058120 A1 | 5/2007 |
| WO | WO-2011081151 A1 | 7/2011 |
| WO | WO-2012048094 A3 | 7/2012 |
| WO | WO-2013119134 A1 | 8/2013 |
| WO | WO-2013146595 A1 | 10/2013 |
| WO | WO-2014152023 A1 | 9/2014 |
| WO | WO-2015088613 A1 | 6/2015 |
| WO | WO-2016043200 A1 | 3/2016 |
| WO | WO-2016065120 A1 | 4/2016 |
| WO | WO-2016144960 A1 | 9/2016 |
| WO | WO-2016158864 A1 | 10/2016 |
| WO | WO-2017066319 A2 | 4/2017 |
| WO | WO-2017169440 A1 | 10/2017 |
| WO | WO-2017198418 A1 | 11/2017 |
| WO | WO-2018004551 A1 | 1/2018 |
| WO | WO-2018173446 A1 | 9/2018 |
| WO | WO-2019023797 A1 | 2/2019 |
| WO | WO-2019059074 A1 | 3/2019 |
| WO | WO-2019199467 A1 | 10/2019 |
| WO | WO-2019217749 A1 | 11/2019 |
| WO | WO-2020030855 A2 | 2/2020 |
| WO | WO-2020050035 A1 | 3/2020 |
| WO | WO-2020102085 A1 | 5/2020 |
| WO | WO-2020263750 A1 | 12/2020 |
| WO | WO-2021072042 A1 | 4/2021 |

OTHER PUBLICATIONS

Chinese First Office Action dated May 24, 2017 issued in Application No. CN 201510053668.7.
Chinese Second Office Action dated Feb. 28, 2018 issued in Application No. CN 201510053668.7.
Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.
European Search Report dated Feb. 15, 2022, in Application No. EP21741104.
Extended European Search Report dated Dec. 23, 2021, in Application No. EP19800353.5.
Gerritsen et al., (Apr. 1, 1986) "Laser-generated plasma as soft x-ray source," J. Appl. Phys., 59(7):2337-2344.
Hamley, I.W., "Nanostructure fabrication using block copolymers", Nanotechnology. Sep. 17, 2003;14(10):R39-R54.
Hench, L.L. and West, J.K., "The sol-gel process," Chemical reviews, Jan. 1, 1990; 90(1) pp. 33-72.
International Preliminary Report on Patentability dated Jul. 1, 2021 issued in Application No. PCT/US2019/067540.

International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 8, 2020 issued in Application No. PCT/US2020/038968.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
KR Office Action dated Feb. 8, 2022, in Application No. KR10-2021-7030794 with English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Nazarov, D.V., et al., "Atomic layer deposition of tin dioxide nanofilms: A review", Rev. Adv. Mater. Sci. Jun. 1, 2015; 40(3):262-75.

(56)                References Cited

OTHER PUBLICATIONS

Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
US Final Office Action, dated May 11, 2017, issued in U.S. Appl. No. 14/610,038.
US Final Office Action, dated Sep. 10, 2018, issued in U.S. Appl. No. 15/691,659.
US Notice of Allowance, dated Apr. 25, 2018 issued in U.S. Appl. No. 14/948,109.
US Notice of Allowance, dated Aug. 22, 2017, issued in U.S. Appl. No. 14/610,038.
U.S. Notice of Allowance dated Feb. 22, 2022 in U.S. Appl. No. 17/310,635.
US Notice of Allowance, dated Jul. 28, 2020, issued in U.S. Appl. No. 16/206,959.
US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Jan. 23, 2017, issued in U.S. Appl. No. 14/610,038.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
U.S. Appl. No. 17/309,247, Weidman et al., filed May 11, 2021.
U.S. Appl. No. 17/309,587, Volosskiy et al., filed Jun. 8, 2021.
U.S. Appl. No. 17/310,635, Tan et al., filed Aug. 13, 2021.
U.S. Appl. No. 17/452,365, Tan et al., filed Oct. 26, 2021.
U.S. Appl. No. 17/753,110, inventors Weidman et al., filed Feb. 18, 2022.
Xu, et al., "Underlayer designs to enhance the performance of EUV resists," Proceedings of SPIE, vol. 7273, 2009, pp. 727311-1-727311-11.
Alf, M.E., et al., "Chemical Vapor Deposition of Conformal, Functional, and Responsive Polymer Films," Advanced Materials, 2010, vol. 22(18), pp. 1993-2027.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Chiang C L., et al., "Secondary Electron Emission Characteristics of Oxide Electrodes In Flat Electron Emission Lamp," AIP Advances, 2016, vol. 6, 015317, 9 Pages.
CN Office Action dated Apr. 24, 2024 in CN Application No. 201980075389.7 with English translation.

CN Office Action dated Aug. 31, 2024 in CN Application No. 201980028279.5 with English translation.
CN Office Action dated Dec. 13, 2023 in CN Application No. 201810783756.6 with English translation.
CN Office Action dated Dec. 26, 2023 in CN Application No. 201980028279.5, with English Translation.
CN Office Action dated Jul. 23, 2024 in CN Application No. 201810783756.6 with English translation.
CN Office Action dated Jun. 1, 2023, in application No. CN201810783756 with English translation.
CN Office Action dated Mar. 14, 2024 in CN Application No. 201810783756.6, with English Translation.
CN Office Action dated Nov. 18, 2022, in Application No. CN201810783756.6 with English Translation.
CN Office Action dated Sep. 28, 2024 in CN Application No. 202080059412.6 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Dahuang, D., et al., Functional Thin Films and Their Deposition Preparation Techniques, Metallurgy Industrial Press, Jan. 31, 2013, pp. 450-454. [with English Translation].
EP Extended European Search report dated Jun. 26, 2023, in Application No. 20831242.1.
EP Extended European Search report dated Jun. 28, 2023, in Application No. EP 20832501.9.
EP Extended European Search report dated Sep. 25, 2023, in Application No. EP20870849.5.
Fitzgerald C B., et al., "Magnetism in Dilute Magnetic Oxide Thin Films Based on SnO2," The American Physical Society, 2006, vol. 74, 115307, 10 Pages.
International Search Report and Written Opinion dated Jul. 13, 2021, in PCT Application No. PCT/US2021/023901.
International Search Report and Written Opinion dated May 18, 2022, in International Application No. PCT/US2022/014984.
International Preliminary Report on Patentability and Written Opinion dated Dec. 26, 2024 in PCT Application No. PCT/US2023/068419.
International Preliminary Report on Patentability dated Apr. 14, 2022 issued in Application No. PCT/US2020/053856.
International Preliminary Report on Patentability dated Aug. 24, 2023, in PCT Application No. PCT/US2022/014984.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 6, 2023 in PCT Application No. PCT/US2023/068419.
International Search Report and Written Opinion dated Oct. 8, 2020 in Application No. PCT/US2020/038968.
Jalife S., et al., "Noble Gas Endohedral Fullerenes," Chemical Science, 2020, vol. 11, pp. 6642-6652.
JP Office Action dated Jul. 26, 2022 in Application No. JP2021102822 With English translation.

(56)      References Cited

OTHER PUBLICATIONS

JP Office Action dated Apr. 30, 2024 in JP Application No. 2021-577241 with English translation.
JP Office Action dated Dec. 24, 2024 in JP Application No. 2021-576792, with English Translation.
JP Office Action dated Dec. 26, 2023 in JP Application No. 2021-526240, with English Translation.
JP Office Action dated Feb. 18, 2025 in JP Application No. 2022-557680, with English Translation.
JP Office Action dated Feb. 18, 2025 in JP Application No. 2023-502905, with English Translation.
JP Office Action dated Feb. 28, 2023 in Application No. JP2020-562160 with English translation.
JP Office Action dated Mar. 22, 2024 in JP Application No. 2020-562160, with English Translation.
JP Office Action dated May 14, 2024 in JP Application No. 2021-576792 with English translation.
JP Office Action dated Oct. 8, 2024 in JP Application No. 2020-562160 with English translation.
JP Office Action dated Sep. 17, 2024 in JP Application No. 2023-502905 with English translation.
JP Office Action dated Sep. 17, 2024 in JP Application No. 2023-502907, with English Translation.
JP Office Action dated Sep. 19, 2023 in Application No. JP2020-562160 with English translation.
JP Office Action dated Sep. 24, 2024 in JP Application No. 2021-526240 with English translation.
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
KR Notice of Allowance dated Dec. 12, 2024 in KR Application No. 10-2016- 0152489, with English Translation.
KR Office Action dated Apr. 23, 2024 in KR Application No. 10-2016-0152489 with English translation.
KR Office Action dated Jan. 24, 2025 in KR Application No. 10-2020-7035732, with English Translation.
KR Office Action dated May 24, 2024 in KR Application No. 10-2020-7035732 with English translation.
KR Office Action dated Nov. 7, 2024 in KR Application No. 10-2023-7005181 with English Translation.
KR Office Action dated Nov. 7, 2024 in KR Application No. 10-2023-7005318, with English Translation.
KR Office Action dated Nov. 28, 2024 in KR Application No. 10-2022-7014447, with English Translation.
KR Office Action dated Oct. 31, 2024 in KR Application No. 10-2022-7003353 with English Translation.
Kvon V., et al., "Secondary Electron Emission Of Tin And Tin-Lithium Under Low Energy Helium Plasma Exposure," Nuclear Materials and Energy, 2017, vol. 13, pp. 21-27.
Lin Y., et al., "A New Examination Of Secondary Electron Yield Data," Surface And Interface Analysis, 2005, vol. 37, pp. 895-900.
Molloy, K. C., "Precursors for the Formation of Tin (IV) Oxide and Related Materials", Journal of Chemical Research, 2008, vol. 2008, No. 10, pp. 549-554.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Saunders M., et al., "Noble Gas Atoms Inside Fullerenes," Science, 1996, vol. 271, pp. 1693-1697.
SG Written Opinion dated Apr. 16, 2024 in SG Application No. 11202114197Y.
SG Written Opinion dated Sep. 2, 2024 in SG Application No. 11202114260T.
Singapore Search Report and Written Opinion dated Mar. 17, 2023 issued in Application No. SG11202114197Y.
Singh R ., "Unexpected Magnetism In Nanomaterials," Journal of Magnetism and Magnetic Materials, 2013, vol. 346, pp. 58-73.

Taiwanese Office Action dated Apr. 10, 2023 in TW Application No. TW108140940 with English translation.
Tian Y F., et al., "Oxide Magnetic Semiconductors: Materials, Properties, And Devices," Magnetism, Magnetic Materials, And Interdisciplinary Research, 2013, vol. 22(8), 2 Pages.
TW Office Action dated Jan. 9, 2023 In Application No. TW20190116155 with English translation.
TW Office Action dated Apr. 29, 2022 in Application No. TW110118172 with English translation.
TW Office Action dated Feb. 21, 2024 in TW Application No. 109121664 with English translation.
TW Office Action dated Feb. 29, 2024 in TW Application No. 109134377, with English Translation.
TW Office Action dated Jan. 2, 2024 in TW Application No. 109121639, with English Translation.
TW Office Action dated Nov. 25, 2024 in TW Application No. 110126458, with English Translation.
TW Office Action dated Oct. 4, 2024 in TW Application No. 110126430 with English translation.
TW Office Action dated Oct. 7, 2024 in TW Application No. 109121639, with English translation.
TW Office Action dated Oct. 30, 2023, in application No. TW108116155 with English Translation.
TW Office Action dated Sep. 25, 2024 in TW Application No. 110111136 with English translation.
U.S. Advisory Action dated May 7, 2024 in U.S. Appl. No. 18/298,003.
U.S. Corrected Notice of Allowance dated Jan. 31, 2024 in U.S. Appl. No. 17/309,247.
U.S. Final Office Action dated Apr. 10, 2024 in U.S. Appl. No. 15/733,598.
U.S. Final Office Action dated Apr. 23, 2024 in U.S. Appl. No. 17/596,928.
U.S. Final Office Action dated Feb. 27, 2024 in U.S. Appl. No. 18/298,003.
U.S. Final Office Action dated May 3, 2024 in U.S. Appl. No. 18/297,989.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Aug. 28, 2024 in U.S. Appl. No. 15/733,598.
U.S. Non-Final office Action dated Feb. 7, 2023 in U.S. Appl. No. 17/455,185.
U.S. Non-Final Office Action dated May 29, 2024 in U.S. Appl. No. 18/298,003.
U.S. Non-Final Office Action dated Oct. 1, 2024 in U.S. Appl. No. 17/596,928.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,928.
U.S. Non-Final Office Action dated Sep. 28, 2023, in U.S. Appl. No. 15/733,598.
U.S. Notice of Allowance dated Oct. 18, 2023 in U.S. Appl. No. 17/309,247.
U.S. Appl. No. 18/869,622, inventors Vrtis R.N et al., filed Nov. 26, 2024.
U.S. Appl. No. 19/064,426, inventors Wu C et al., filed Feb. 26, 2025.
U.S. Restriction Requirement dated Nov. 14, 2022 in U.S. Appl. No. 17/455,185.
U.S. Restriction Requirement dated Apr. 8, 2024 in U.S. Appl. No. 17/754,019.
U.S. Restriction requirement dated Aug. 4, 2023, in U.S. Appl. No. 18/297,989.
U.S Restriction requirement dated Aug. 18, 2023 in U.S. Appl. No. 18/298,003.
JP Office Action dated Aug. 19, 2025 in JP Application No. 2022-557680, with English Translation.

(56) References Cited

OTHER PUBLICATIONS

JP Office Action dated Jul. 8, 2025 in JP Application No. 2023-502905, with English Translation.
KR Notice of Allowance and Search Report dated Aug. 5, 2025 in KR Application No. 10-2022-7003353, with English translation.
KR Office Action dated Jul. 31, 2025 in KR Application No. 10-2023-7005320 with English translation.
U.S. Non-Final Office Action dated Jul. 11, 2025 in U.S. Appl. No. 18/005,328.
US Non-Final Office Action dated Jul. 16, 2025 in U.S. Appl. No. 17/905,754.
Waard H D., et al., "Observations on Implanted Xenon-133 Sources," Proceedings of the Royal Society of London. Series A, Mathematical and Physical Sciences, Jun. 1969, vol. 311 (1504), pp. 139-150.
CN Office Action dated May 6, 2025 in CN Application No. 202080081121 7, with English Translation.
CN Office Action dated May 6, 2025 in CN Application No. 202080060616.1, with English Translation.
JP Office Action dated Apr. 15, 2025 in JP Application No. 2023502908, with English Translation.
JP Office Action dated May 27, 2025 in JP Application No. 2023502903, with English Translation.
KR Notice of Allowance and Search Report dated Jun. 4, 2025 in KR Application No. 10-2023-7005181, with English translation.
KR Notice of Allowance and Search Report dated Jun. 5, 2025 in KR Application No. 10-2023-7005318, with English translation.
KR Office Action dated Apr. 17, 2025 in KR Application No. 10-2022-7003086, with English Translation.
KR Office Action dated Mar. 19, 2025 in KR Application No. 10-2022-7038020, with English Translation.
KR Office Action dated Mar. 24, 2025 in KR Application No. 10-2023-7005613, with English Translation.
TW Office Action and Search Report dated Apr. 24, 2025 in TW Application No. 108116155, with English Translation.
TW Office Action and Search Report dated May 27, 2025 in TW Application No. 110126442, with English Translation.
U.S. Appl. No. 19/096,607, inventors Berney B et al., filed Mar. 31, 2025.
U.S. Restriction Requirement dated Mar. 26, 2025 in U.S. Appl. No. 17/905,754.
CN Office Action dated Oct. 14, 2025 in CN Application No. 202080060616.1, with English Translation.
KR Office Action dated Oct. 22, 2025 in KR Application No. 10-2023-7032772, with English Translation.
KR Office Action dated Oct. 27, 2025 in KR Application No. 10-2023-7028523, with English Translation.
TW Office Action and Search Report dated Oct. 23, 2025 in TW Application No. 111106161, with English Translation.
TW Office Action and Search Report dated Oct. 30, 2025 in TW Application No. 113148851, with English Translation.

* cited by examiner

Composition of Representative Films

Absorption of Light with Film Depth

FIG. 1C                  FIG. 1D

Initial mixture of bismuth and isopropyltin precursors

Transition over time during deposition

Transition to Bismuth-free precursor to produce organotin composition
near surface Initial mixture using water and tellurium-containing co-reactants +H₂O
+ (CH₃)₃Si - Te - Si(CH₃)₃

Transition over time during deposition

Transition to mixture using water as
co-reactant, without tellurium-
containing co-reactant

+H₂O

PHOTORESIST WITH MULTIPLE PATTERNING RADIATION-ABSORBING ELEMENTS AND/OR VERTICAL COMPOSITION GRADIENT

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD

This disclosure relates generally to the field of semiconductor processing. In particular aspects, the disclosure describes novel photoresist (PR) materials that are made via the reaction between one or more organo-metal precursors and one or more counter-reactants.

BACKGROUND

As semiconductor fabrication continues to advance, feature sizes continue to shrink and new processing methods are needed. One area where advances are being made is in the context of patterning, for example using photoresist materials that are sensitive to lithographic radiation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, materials, apparatus, and systems for depositing a photoresist material on a substrate. In one aspect of the disclosed embodiments, a method of depositing a photoresist material on a substrate is provided, the method including: providing the substrate in a reaction chamber; providing a first reactant and a second reactant to the reaction chamber and initiating a reaction between the first reactant and the second reactant to thereby deposit the photoresist material on the substrate, where the first reactant and the second reactant are each provided to the reaction chamber in vapor phase, where the first reactant is an organo-metallic precursor having a formula of $M1_aR1_bL1_c$, where: M1 is a metal having a high patterning radiation-absorption cross-section, R1 is an organic group that survives the reaction between the first reactant and the second reactant and is cleavable from M1 under exposure to patterning radiation, L1 is a ligand, ion, or other moiety that reacts with the second reactant, $a \geq 1$, $b \geq 1$, and $c \geq 1$, and where at least one of the following conditions is satisfied: (a) the photoresist material includes two or more elements having a high patterning radiation-absorption cross-section, and/or (b) the photoresist material includes a composition gradient along a thickness of the photoresist material.

In various embodiments, the photoresist material may be an extreme ultraviolet (EUV) photoresist material, and M1 may have a high EUV-absorption cross-section. In some cases, the second reactant may include a hydroxyl moiety. In some cases, the second reactant may include a material selected from the group consisting of: water, a peroxide, a di- or polyhydroxy alcohol, a fluorinated di- or polyhydroxy alcohol, a fluorinated glycol, and combinations thereof. In some cases, the second reactant may include a material that can crosslink metal atoms via sulfur bridges and/or tellurium bridges. In some embodiments, the second reactant may include a material selected from the group consisting of: hydrogen sulfide, hydrogen disulfide, bis(trimethylsilyl)tellurium, and combinations thereof. In some embodiments, the second reactant may include hydrogen iodide. In various embodiments, the second reactant replaces one or more L1 to thereby crosslink two or more atoms of M1 via chemical bonding.

A number of different metals may be used for M1. In various embodiments, the EUV-absorption cross-section of M1 may be equal to or greater than $1 \times 10^7$ cm$^2$/mol. In these or other cases, M1 may include a metal selected from the group consisting of: Sn, Sb, In, Bi, Te, and combinations thereof. Similarly, a number of different organic groups may be used for R1. In some cases, R1 may include an alkyl group or a halogen-substituted alkyl group. In some such cases, the alkyl group may include three or more carbon atoms. In these or other cases, R1 may include at least one beta-hydrogen or beta-fluorine. In some embodiments, R1 may be selected from the group consisting of: i-propyl, n-propyl, t-butyl, i-butyl, n-butyl, sec-butyl, n-pentyl, pentyl, t-pentyl, sec-pentyl, and combinations thereof. Further, a number of different groups may be used for L1. In some embodiments, L1 may include a moiety selected from the group consisting of: an amine, an alkoxy, a carboxylate, a halogen, and combinations thereof.

Various example reactants are provided herein. In some cases, the first reactant may include a material selected from the group consisting of: t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, t-butyl tris(t-butoxy) tin, i-butyl tris(t-butoxy) tin, n-butyl tris(t-butoxy) tin, sec-butyl tris(t-butoxy) tin, i-propyl(tris)t-butoxy tin, n-propyl tris(t-butoxy) tin, t-butyltrichlorotin, i-butyltrichlorotin, n-butyltrichlorotin, sec-butyltrichlorotin, i-propyltrichlorotin, n-propyltrichlorotin, t-butyltribomotin, i-butyltribomotin, n-butyltribomotin, sec-butyltribomotin, i-propyltribromotin, n-propyltribromotin, and combinations thereof.

In some cases, the method may further include exposing the substrate to plasma to replace some M1-L1 bonds with M1-H bonds. In certain embodiments, the reaction between the first reactant and the second reactant may be a chemical vapor deposition reaction, an atomic layer deposition reaction, or a combination thereof. In some cases, the first reactant and the second reactant may be provided to the reaction chamber concurrently. In other cases, the first reactant and the second reactant are not delivered to the reaction chamber concurrently.

In some embodiments, a temperature of the substrate may be at or below a temperature of the first and second reactants when they are delivered to the reaction chamber. In these or other embodiments, initiating the reaction between the first and second reactants may include exposing the substrate to plasma. In some embodiments, initiating the reaction between the first and second reactants may include exposing the substrate to thermal energy.

In a number of embodiments, the method may further include providing a third reactant to the reaction chamber and initiating a reaction between the second reactant and the third reactant or between the third reactant and a fourth reactant. In some such cases, each of the first and third reactants may include a metal selected from the group consisting of Sn, Sb, In, Bi, and Te, and the metal in the first reactant may be different from the metal in the second reactant.

In a number of cases, the photoresist material deposited on the substrate includes the composition gradient along a thickness of the photoresist material. In some such cases, the photoresist material includes M2 in addition to M1, where M2 is a metal having a high EUV-absorption cross-section and is different from M1, where the composition gradient in the photoresist material provides different ratios of M1:M2 at different vertical positions within the photoresist material. In some embodiments, the composition gradient in the photoresist material may provide different ratios of M1:R1 at different vertical positions within the photoresist material. In some such cases, a percentage of metal atoms bonded to R1 may vary at different vertical positions within the photoresist material. In some embodiments, the composition gradient in the photoresist material may provide different concentrations of I or Te at different vertical positions within the photoresist material. In various embodiments, the composition gradient may provide a higher density of high-EUV absorbing elements in a bottom part of the photoresist material compared to a top part of the photoresist material, the bottom part being deposited before the top part.

In some embodiments, the method may further include before providing the first reactant to the reaction chamber, providing a third reactant to the reaction chamber and initiating a reaction between the second reactant and the third reactant, or between the third reactant and a fourth reactant, to thereby deposit an initial portion of the photoresist material, where the third reactant has a formula $M2_aL2_c$, where: M2 is a metal with a high EUV-absorption cross-section, L2 is a ligand, ion, or other moiety that reacts with the second reactant or with the fourth reactant, $a \geq 1$, and $c \geq 1$, such that the initial portion of the photoresist material does not incorporate RE In these or other embodiments, the method may further include repeatedly exposing the substrate to plasma to remove some R1 from the photoresist material, where conditions used to generate the plasma change over time such that there is a gradient in the concentration of M1-R1 bonds within the photoresist material. In some such embodiments, a power used to generate the plasma may be reduced over time such that there is a relatively lower concentration of M1-R1 bonds near a bottom of the photoresist material, and a relatively higher concentration of M1-R1 bonds near a top of the photoresist material. In various implementations, the photoresist material may include a vertical density gradient.

In certain cases, the method may further include exposing the photoresist material to EUV and developing the photoresist material to form a pattern, where developing the photoresist material occurs through wet processing or dry processing. In various embodiments, the photoresist material may provide depth-dependent EUV sensitivity.

In another aspect of the disclosed embodiments, a method of depositing a photoresist material on a substrate is provided, the method including: providing the substrate in a reaction chamber; and providing a first reactant and a second reactant to the reaction chamber and initiating a reaction between the first reactant and the second reactant to thereby deposit the photoresist material on the substrate, where the first reactant and the second reactant are each provided to the reaction chamber in vapor phase, and where the photoresist material provides a plurality of patterning radiation absorber species and/or depth-dependent sensitivity to patterning radiation.

In another aspect of the disclosed embodiments, a photoresist material is provided, the photoresist material being formed by any of the methods claimed or otherwise described herein.

In another aspect of the disclosed embodiments, an apparatus for depositing a photoresist material on a substrate is provided, the apparatus including: a reaction chamber; an inlet for introducing gas phase reactants; an outlet for removing materials from the reaction chamber; a substrate support in the reaction chamber; and a controller having at least one processor, where the at least one processor is configured to cause any of the methods claimed or otherwise described herein.

These and other aspects are described further below with reference to the drawings.

BRIEF DESCRIPTION OF THE DRAWINGS

FIGS. 1C-1E illustrate different resist films having different absorption and transmission characteristics.

DETAILED DESCRIPTION

Figure 1A:
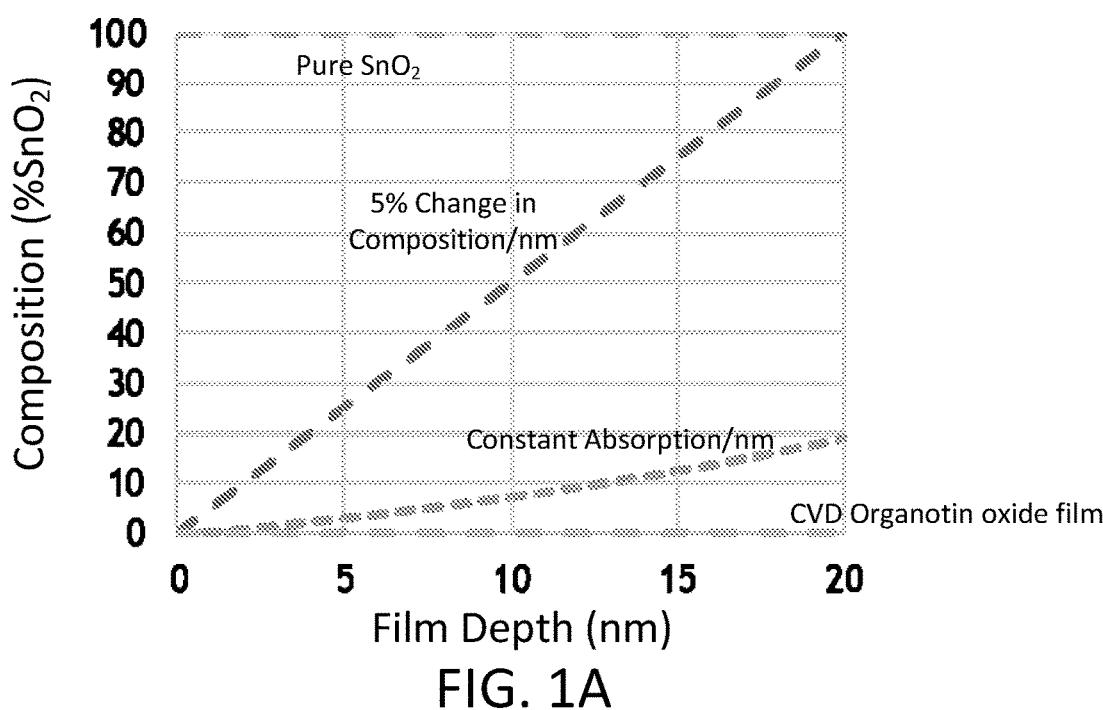
FIG. 1A is a graph depicting the composition of different representative films at different depths.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern. The patterned and developed photoresist film then can be used as an etch mask to transfer the pattern into the underlying films that are composed of metal, oxide, etc.

Advanced technology nodes (as defined by the International Technology Roadmap for Semiconductors) include nodes 22 nm, 16 nm, and beyond. In the 16 nm node, for example, the width of a via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

Traditional organic chemically amplified resists (CAR) have a few drawbacks when used in EUV lithography, particularly low absorption coefficient in EUV region and the diffusion of photo-activated chemical species. To overcome the low absorption coefficient, a thick CAR film is necessary but at the risk of pattern collapse. Diffusion of photo-activated species on the other hand, has detrimental impact on pattern fidelity such as line width roughness. In addition, poor etch selectivity also necessitates the use of additional underlayers for pattern transfer. As such, the lithographic performance of current CARs is unable to match the spatial resolution performance of EUV scanners.

Directly photopatternable EUV resists may contain metals and/or metal oxides mixed within organic components. These organometallic resists are highly promising in that they can enhance the EUV photon adsorption and generate secondary electrons and/or show increased etch selectivity to an underlying film stack and device layers.

Organometallic resists such as those available from Inpria Corp, Corvalis, OR, enjoy a substantially higher absorption coefficient and can be significantly thinner while still providing good etch resistance. These films are described, for example, in US Patent Publications US 2017/0102612 and US 2016/0116839, each of which is incorporated by reference herein at least for their disclosure of photopatternable metal oxide-containing films. However, as a spin-on formulation resulting in a spatially homogenous film, Inpria films suffer from the depth-dependent dose concern described previously—once a material starts absorbing around 30% or more of the incident EUV photons there are unavoidably fewer making it to the bottom of the film to induce the chemical effects required to permit selective development. Furthermore, stability in solution has been cited as a drawback of Inpria formulations.

Currently, all commercially available EUV photoresists for high-resolution patterning applications are solution-based (wet) spin-on formulations. Dry deposition of metal-organic based resists has also been described, for example in our prior International Application PCT/US19/31618, filed May 9, 2019, and titled METHODS FOR MAKING EUV PATTERNABLE HARD MASKS, the disclosure of which relating to the composition, deposition, and patterning of directly photopatternable metal-organic based metal oxide films to form EUV resist masks is incorporated by reference herein. In most or all of these metal-organic based resists, other than the metal center (mostly Sn), all other elements have low EUV absorption cross-section. The introduction of other, highly-EUV-absorbing, elements into the resist either as metal center or as part of the counter-reactant or substitution in the bulky organic groups can further increase the EUV absorption in the PR and thus further reduce the EUV dosage required for patterning.

Moreover, the Inpria spin-on films are believed to be homogenous throughout the thickness of the film, having some fixed percentage of alkyl-connected Sn atoms across the film. In our dry-deposited films, it is possible to tune the composition during the deposition and to create a film with vertical composition gradient. To the best of our knowledge, this has not been achieved in any spin-on EUV PR formulation.

EUV photoresist (PR) materials in accordance with this disclosure may be formed using organo-metallic precursors having a metal center that is chosen from among the elements that have high EUV-absorption cross-section, such as In, Sn, Sb, Bi, and Te. At least one of the precursors should also have one or more bulky organic group that can survive the chemical reaction but is cleavable under EUV. While this disclosure is not limited by any particular theory or mechanism of operation, it is believed that the steric hindrance of the bulky organic group(s) prevents the formation of a densely packed network and produces porous films with low density. The counter-reactants should be able to replace the original ligands on the metal center during the reaction to form cross-linked materials. Moreover, the counter-reactants and/or the bulky organic group can also contain additional high-EUV-absorbing elements, such as I and Te.

Such PR films can be deposited using gas-phase deposition methods such as CVD and ALD. For some combinations of precursor(s) and counter-reactant(s), the reaction can also be realized in the solution phase, producing small clusters of active EUV PR materials, which can then be coated on a substrate via a spin-coating process. Upon EUV exposure, high-EUV-absorbing elements in the PR will absorb EUV light and generate a large number of secondary electrons. Within their mean free path (typically a few nm), these electrons can induce chemical reactions to cleave the chemical bond between metal centers and bulky organic groups. The changes following such bond cleavage, such as hydride/hydroxyl formation, cross-linking, surface polarity change, film shrinkage, and decreased solubility create chemical contrast that can be utilized for development, including both wet and dry development, as well as potentially surface imaging/selective deposition strategies.

Another strategy that can further improve the EUV sensitivity in a PR film is to create a film where the film composition is vertically graded, resulting in depth-dependent EUV sensitivity. In a homogenous PR with a high absorption coefficient, the decreasing light intensity throughout the film depth necessitates a higher EUV dose to ensure the bottom is sufficiently exposed. By increasing the density of atoms with high EUV absorptivity at the bottom of the film relative to the top of the film (i.e., by creating a gradient with increasing EUV absorption) it becomes possible to more efficiently utilize available EUV photons while more uniformly distributing absorption (and the effects of secondary electrons) towards the bottom of more highly absorbing films.

The strategy of engineering a vertical composition gradient in a PR film is particularly applicable to dry deposition methods such as CVD and ALD and can be realized by tuning the flow ratios between different reactants during deposition. The type of composition gradients that can be engineered include: the ratios between different high-absorbing metals, the percentage of metal atoms that have EUV-cleavable bulky groups (or relatedly, the ratios between the metal atoms and the EUV-cleavable bulky groups), the percentages of bulky groups or counter-reactants that contain high-absorbing elements (such as Te, and I) (or relatedly, the ratios between the metal atoms and the additional high-absorbing elements such as Te and I), and combinations of the above.

The composition gradient in the EUV PR film can also bring additional benefits. For instance, high density of high-EUV-absorbing elements in the bottom part of the film can effectively generate more secondary electrons that can better expose upper portions of the film. In addition, such compositional gradients can also be directly correlated with a higher fraction of EUV absorbing species which are not bonded to bulky, terminal substituents. For example, in the case of Sn-based resists, the incorporation of tin precursors with four leaving groups is possible, thereby promoting the formation of Sn—O-Substrate bonding at the interface for improved adhesion.

Described below are some examples of how to create metal organic resists in accordance with this disclosure, and some of the possible technological advantages that may be available.

Precursor Description

In general, the described methods involve flowing organometallic precursors that comprise at least one alkyl group on each metal atom that can survive the vapor-phase deposition reaction, while other ligands or ions coordinated to the metal can be replaced by the counter-reactants. Suitable organometallic precursors include those of the formula:

$$M1_aR1_bL1_c \qquad \text{(Formula 1)}$$

wherein: M1 is a metal with a high patterning radiation-absorption cross-section (e.g., equal to or greater than $1\times10^7$ $cm^2$/mol), such as Sn, Sb, In, Bi, Te, and combinations thereof; R1 is an alkyl (or halogen-substituted alkyl) group, such as $C_nH_{2n+1}$, preferably wherein $n \geq 3$; L1 is a ligand, ion or other moiety which is reactive with the counter reactant; $a \geq 1$; $b \geq 1$; and $c \geq 1$.

In various embodiments, the patterning radiation is EUV radiation, and M1 is a metal with a high EUV radiation-absorption cross-section. Where other kinds of patterning radiation are used, M1 may have a high absorption cross-section with regard to the type of patterning radiation that is used to develop the photoresist material.

In addition, suitable organometallic precursors that do not have an alkyl group and instead have only ligands or ions coordinated to the metal atom that can be replaced by the counter-reactants, include:

$$M2_aL2_c \qquad \text{(Formula 2)}$$

wherein: M2 is a metal with a high EUV absorption cross-section which may be the same as M1 or different; L2 is a ligand, ion or other moiety which is reactive with the counter reactant; $a \geq 1$ and $c \geq 1$. Counter-reactants preferably have the ability to replace the reactive moieties ligands or ions (e.g., L1 in Formula 1, and/or L2 in Formula 2, above) so as to link at least two metal atoms via chemical bonding.

In various embodiments, the patterning radiation is EUV radiation, and M2 is a metal with a high EUV radiation-absorption cross-section. Where other kinds of patterning radiation are used, M2 may have a high absorption cross-section with regard to the type of patterning radiation that is used to develop the photoresist material.

Counter-reactants can include water, peroxides (e.g., hydrogen peroxide), formic acid, alcohols (e.g., di- or polyhydroxy alcohols, fluorinated di- or polyhydroxy alcohols, fluorinated glycols), oxygen, ozone, other sources of hydroxyl moieties, and combinations thereof. In various embodiments, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges and bis(trimethylsilyl)tellurium which can crosslink metal atoms via tellurium bridges. In addition, hydrogen iodide may be utilized to incorporate iodine into the film.

In various embodiments, R1 may be fluorinated, e.g., having the formula $C_nF_xH_{(2n+1)}$ In various embodiments, R1 has at least one beta-hydrogen or beta-fluorine. For example, R1 may be selected from the group consisting of i-propyl, n-propyl, t-butyl, i-butyl, n-butyl, sec-butyl, n-pentyl, i-pentyl, t-pentyl, sec-pentyl, and mixtures thereof, any of which may be fluorinated.

L1 or L2 may be any moiety readily displaced by a counter-reactant to generate a corresponding M-OH moiety, such as a moiety selected from the group consisting of amines (such as dialkylamino, monalkylamino), alkoxy, carboxylates, halogens, and mixtures thereof.

Organometallic precursors may be any of a wide variety of candidate metal-organic precursors. For example, where M1 and/or M2 is tin, such precursors include t-butyl tris (dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds such as t-butyl tris(t-butoxy) tin, i-butyl tris(t-butoxy) tin, n-butyl tris(t-butoxy) tin, sec-butyl tris(t-butoxy) tin, i-propyl(tris) t-butoxy tin, n-propyl tris(t-butoxy) tin, as well as halogen substituted forms of these materials. In some examples, the organometallic precursor may include t-butyltrichlorotin, i-butyltrichlorotin, n-butyltrichlorotin, sec-butyltrichlorotin, i-propyltrichlorotin, n-propyltrichlorotin, t-butyltribomotin, i-butyltribomotin, n-butyltribomotin, sec-butyltribomotin, i-propyltribromotin, n-propyltribromotin, etc. In some embodiments, the organometallic precursors are partially fluorinated. In some embodiments, less reactive/more controllable leaving groups such as t-butoxy are advantageously used.

Further description of precursors and methods for their deposition as EUV photoresist films applicable to this disclosure may be found in International Application PCT/US19/31618. The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the substrate, after deposition of the film, or both. In some embodiments, a gentle remote $H_2$ plasma may be introduced so as to replace some M1-L and/or M2-L bonds (e.g., Sn-L bonds) with M1-H and/or M2-H bonds (e.g., Sn—H bonds), for example, which can increase reactivity of the resist under EUV.

In various embodiments, the EUV-patternable films are made and deposited on the substrate using vapor deposition equipment and processes among those known in the art. In such processes, the polymerized organometallic material is formed in vapor phase or in situ on the surface of the substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space. The reactions may be driven by thermal energy or plasma energy.

In general, methods comprise mixing a vapor stream of an organometallic precursor with a vapor stream of a counter-reactant so as to form a polymerized organometallic material, and depositing the organometallic material onto the surface of the semiconductor substrate. As will be understood by one of ordinary skill in the art, the mixing and depositing aspects of the process may be concurrent, in a substantially continuous process.

In an exemplary continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function or utility of present technology, it is believed that the product from such vapor-phase reaction becomes heavier in molecular weight as metal atoms are crosslinked by counter-reactants, and is then condensed or otherwise deposited onto the substrate. In various embodiments, the steric hindrance of the bulky alkyl groups prevents the formation of a densely packed network and produces porous, low density films. In various cases, a low density film has a density between about 2-2.5 $g/cm^3$.

The CVD process is generally conducted at reduced pressures, such as from 10 milliTorr to 10 Torr. In some embodiments, the process is conducted at from 0.5 to 2 Torr. The temperature of the substrate is preferably at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

For the remainder of this description organotin moieties are used as the primary example of an EUV reactive moiety to which other Sn as well as non-Sn precursors can be added to alter EUV absorbing characteristics. Other organometallic species can be used, consistent with this disclosure.

A potential advantage of using dry deposition methods is ease of tuning the composition of the film as it grows. In a CVD process, this may be accomplished by changing the relative flows of the two or more metal-containing precursors during deposition. Deposition may occur between 30-200° C. at pressures between 0.01-100 Torr—but more generally between about 0.1 Torr and 10 Torr.

In an ALD process, this may be accomplished by changing the relative ratio of cycles of one precursor versus another. For example, while initially a process may be 5×[dose precursor A–purge–dose counter reactant–purge]+1×[dose precursor B–purge–dose counter reactant–purge] to produce an A-heavy film, later in the film growth the cycles may change to 1×[dose precursor A–purge–dose counter reactant–purge]+5×[dose precursor B–purge–dose counter reactant–purge] to produce a B-heavy film. Deposition may occur between 30-300° C. at pressures between 0.01-10 Torr. The ALD processes may have an incomplete purge between precursor and counter-reactant pulses, thus adding a CVD component to the growth.

Dry Deposition of Gradient Films Through ALD/CVD Methods (Non-Plasma)

One example system to produce graded Sn-based resists with varying alkyl groups involves the use of tetrakis (dimethylamino)tin and isopropyltris(dimethylamino)tin precursors and water as a counter-reactant. The tetrakis (dimethylamino)tin is initially introduced as a minor to significant component to produce a relatively dense component of Sn that is not bonded to an alkyl group (essentially $SnO_2$ and Sn—OH derivatives). The ratio of tetrakis(dimethylamino)tin:isopropyltris(dimethylamino)tin precursors decreases as the film grows. This produces a film with an increasing amount of Sn—R bonds in the film toward the upper surface of the film. (An example of the increase in the absorption of a film produced by this process is described below). This process may be performed either by ALD or CVD methods.

Figure 2A:
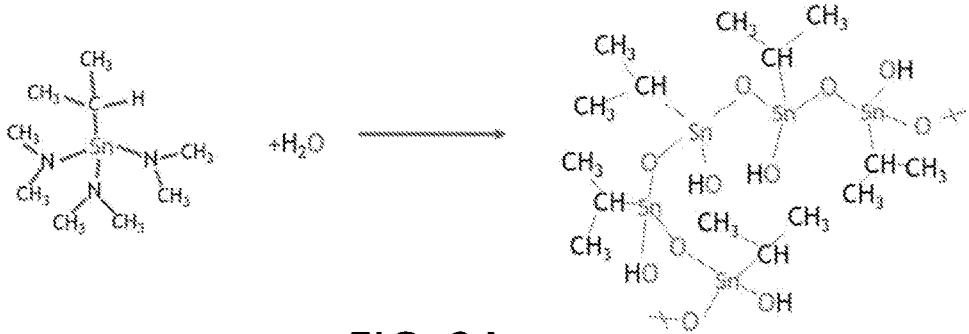
FIG. 2A shows an embodiment where a resist film is deposited with a composition gradient, with bismuth and tin near the bottom of the resist and tin near the top of the resist.

Another example may be to add different metals to the system for enhanced absorption. For example, a gradient film with bismuth and tin metal centers may be synthesized using isopropyltris(dimethylamino)tin and tris(dimethylamino)bismuth, as shown in FIG. 2A. The ratio of tris (dimethylamino)bismuth:isopropyltris(dimethylamino)tin in the precursor flow is decreased as the film is deposited. This results in the bottom of the film containing more bismuth metal centers than the top of the film. Like Sn, Bi atoms exhibit extremely high EUV cross-section, but unlike Sn, even without a bulky, EUV labile substituent, appears less prone towards condensation to an intractable, binary metal oxide. As such, a process employing tris(dimethyamino)bismuth may be substantially superior to one based on tetrakis(dimethylamino)tin in some contexts or applications, as a substantially lower negative impact on both wet (aqueous and non-aqueous) and dry (e.g., HCl or HBr-based, such as described in our U.S. Application No. 62/866,942, filed Jun. 26, 2019, incorporated by reference herein for the purpose of describing applicable dry development techniques) development strategies is anticipated.

A related approach involving an absorption gradient targets the use of somewhat tin-based resist films using two precursors—both with alkyl groups—but one containing one or more alkyl ligands than the other. For example, isopropyltris(dimethylamino)tin and diisopropyldi(dimethylamino)tin can be used. Initially, a flow of the diisopropyldi (dimethylamino)tin is introduced during the film deposition and the ratio is increased relative to the flow of isopropyltris (dimethylamino)tin as the film is deposited. This results in a film with a higher amount of Sn bonded to two alkyl groups on the surface relative to the bottom of the film.

Figure 2B:
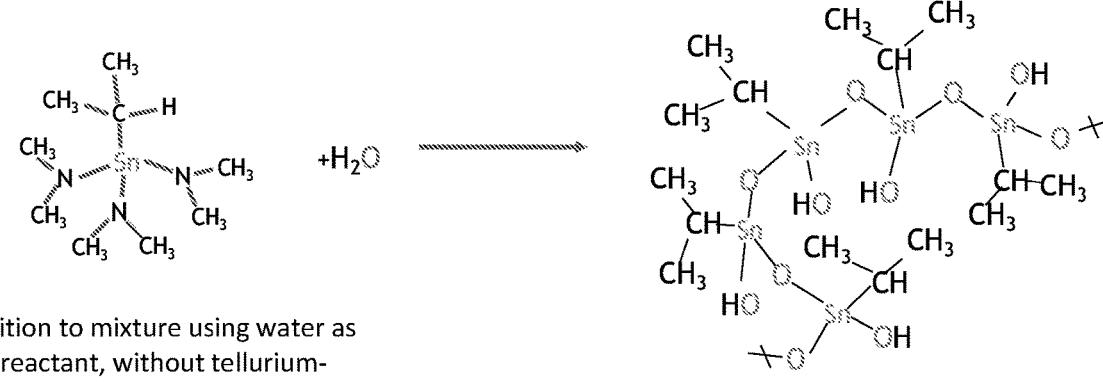
FIG. 2B shows an embodiment where a resist film is deposited with a composition gradient, with tin and tellurium near the bottom of the resist and tin near the top of the resist.

Yet another strategy involves the introduction of an alternative (or additional) co-reactant to water for the introduction of an element with a far higher EUV absorption coefficient than oxygen. One example is the incorporation of tellurium, as shown in FIG. 2B. Bis(trimethyl)tellurium offers a viable option as a gas phase co-reactant. In some embodiments, this can be combined with an alkyltin precursor such as tris(t-butoxy)isopropyltin and water. In this way thin films absorbing 80% of EUV radiation or higher can be produced with little reduction of reactive Sn-alkyl moieties near the bottom of the films. As shown in FIG. 2B, during an initial portion of the deposition, the co-reactant includes both water and bis(trimethyl)tellurium. The initial film that forms on the underlying substrate has substantial amounts of both tin and tellurium. As the deposition progresses, the ratio of bis(trimethyl)tellurium:tris(t-butoxy) isopropyltin decreases, thereby forming film that has relatively less tellurium and relatively more tin, as compared to the initial portion of the film. In various embodiments, the film may transition to a tellurium-free composition near the top surface of the film, for example to help minimize contamination and handling issues.

A similar strategy (also employing tris(t-butoxy)isopropyltin and water as the base chemistry), can be employed for the gradient introduction of iodine using low concentrations of HI (or suitable alkyl iodide) together with water to achieve gradient doping with iodine near the interface.

While this section refers to non-plasma methods for dry deposition of gradient films, it is understood that any of the strategies can be applied to plasma-based deposition methods, as well.

Dry Deposition of Gradient Films Through ALD/CVD Methods (Plasma):

Another method to create graded films involves the use of a plasma to remove some of the alkyl groups bonded to metal centers during the initial deposition of the film. For example, the Sn-alkyl bond is cleaved easily in the presence of plasma either by VUV or the bombardment of electrons or ions from the plasma. Ideally, a plasma with conditions that simply removes the alkyl groups, but does not etch the film, is used. For example, an $O_2$, Ar, He, or $CO_2$ plasma may be used. As the film is deposited, the efficiency of the plasma for removing alkyl groups is reduced (i.e., the power of the plasma is reduced), and eventually is turned off. This results in a graded film with a higher number of M-alkyl bonds at the surface of the film than the bottom of the film.

Patterning Exposure

Following deposition and optional post-application bake, the gradient film is exposed. EUV, 193 nm, or an electron beam may be used to expose the film. In many embodiments, EUV is used. It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Figure 1B:
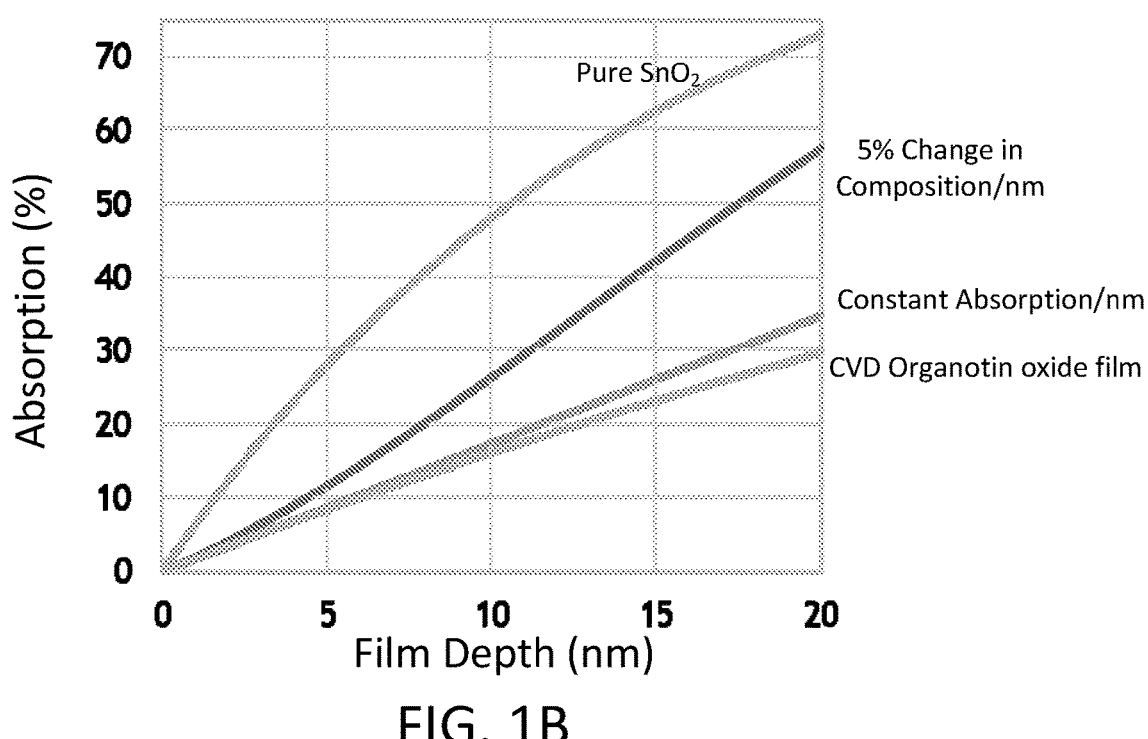
FIG. 1B is a graph depicting the absorption of light at different film depths for different representative films.

A possible advantage to gradient films is a higher EUV absorption. The graded Sn-based film where there is a higher density of Sn-alkyl bonds at the surface than the bottom is one example. It can be readily calculated based on density, EUV cross-section of constituent elements, and stoichiometry that $SnO_2$ has a higher linear absorption coefficient than CVD organotin oxide films as described herein and in International Application PCT/US 19/3161; that is, $SnO_2$ absorbs more EUV photons than CVD organotin oxide films for a given volume. The absorption of EUV photons can be calculated by Beer's Law. FIG. 1A depicts composition vs. film depth for various representative films. FIG. 1B depicts absorption vs. film depth for these same representative films, with estimations made based on Beer's Law.

It may be advantageous to capture a greater amount of the incoming EUV light that is incoming to the wafer to cause contrast between the exposed and unexposed regions. A thick enough resist should be used such that the pattern can be subsequently transferred to subsequent layers. In general, about 70% transmission of the light to bottom of the resist should occur in cases where the resist is compositionally homogeneous. However, a greater amount of absorption and a lower amount of transmission may be appropriate in cases where the resist has a graded composition, since the graded composition can counteract non-uniformities in absorption behavior that otherwise occur with homogeneous resist compositions.

For the example Sn case, it can be advantageous to incorporate areas that have higher absorption, particularly near the bottom of the film near the underlying substrate. These regions absorb more EUV light, generating more secondary electrons that can expose neighboring regions (e.g., about 1 nm radius for the CVD organotin oxide films as described herein). One possible method would be to include regions that have fewer Sn-alkyl bonds, effectively a more $SnO_2$-like material, toward the bottom of the film, and more Sn-alkyl bonds toward the top of the film.

Figure 1E:
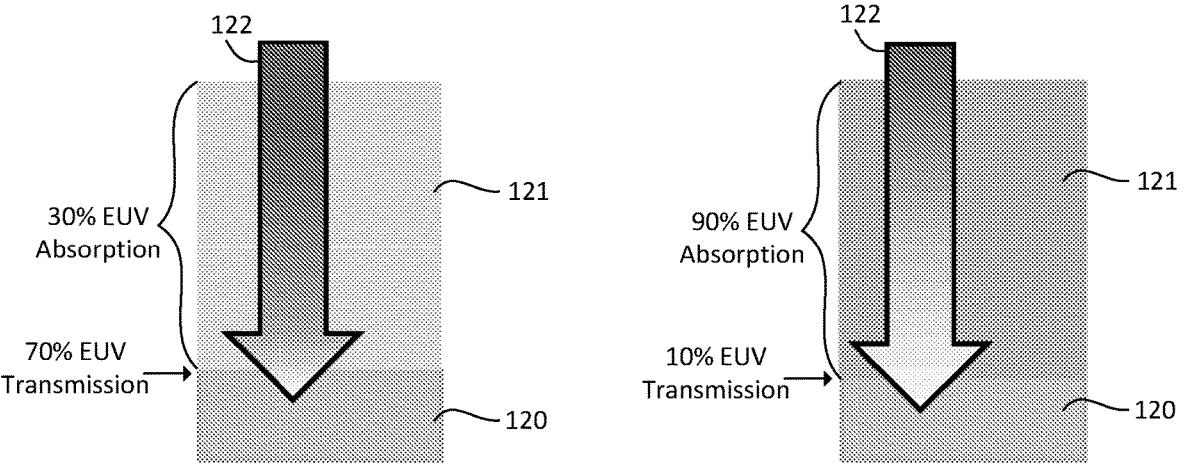
Figure 1E:
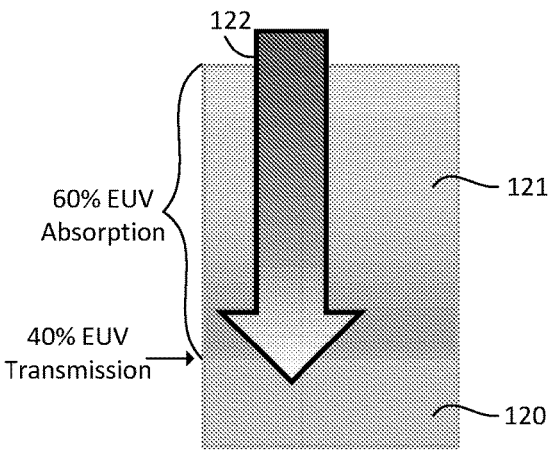

Some examples of different composition gradients are shown in FIG. 1A, and the corresponding absorptions are shown in FIG. 1B. Further, FIGS. 1C-1E depict different EUV photoresists and the resulting absorption/transmission that they provide. In these figures, EUV photoresist 121 is positioned on underlying substrate 120. EUV radiation 122 shines on the EUV photoresist 121, with differing amounts of the EUV radiation 122 being absorbed by the EUV photoresist 121, and as a consequence, differing amounts of EUV radiation being transmitted through the EUV photoresist 121 onto the underlying substrate 120. The photoresist 121 of FIG. 1C is a homogeneous organotin oxide photoresist having relatively low EUV absorption of 30%, with 70% transmission. The photoresist 121 of FIG. 1D is a homogeneous film having a relatively high EUV absorption of 90%, with 10% transmission (because EUV absorption and resulting chemistry would be weighted toward the top of the photoresist, this photoresist would generally be ineffective for patterning applications). The photoresist 121 of FIG. 1E is a graded tin-based EUV photoresist that has a composition gradient providing an overall 60% EUV absorption, with 40% transmission. The increasing EUV absorption gradient provided by the composition gradient in FIG. 1E results in more uniform absorption throughout the thickness of the photoresist 121. As can be readily seen, the inclusion of regions with higher $SnO_2$-like properties increase EUV absorption in the film. The given examples are all increasing in Sn-alkyl content toward the surface of the film, but concepts where there are laminate layers of alternating Sn-alkyl heavy, Sn-alkyl light regions are also envisioned.

Development Strategies

Following exposure and an optional bake, the film will be developed Films may be either wet developed or dry developed. The selected film and chemistry may be designed such that the unexposed film can be selectively removed over the exposed film.

Suitable dry development processes have been demonstrated for EUV photoresist compositions based on organotin oxides, being applicable to both commercially available spin-coatable formulations (e.g., from Inpria Corp) and formulations applied using dry vacuum deposition techniques, referenced above. Negative tone dry development has been achieved by the selective dry development (removal) of non-EUV exposed regions exposed to flows comprising hydrogen halides or hydrogen and halides, including HCl and/or HBr without striking a plasma, or flows of $H_2$ and $Cl_2$ and/or $Br_2$ with a remote plasma or UV radiation generated from plasma to generate radicals. Examples of processes for dry development involve an organotin oxide-containing EUV-sensitive photoresist thin film (e.g., 10-40 nm thick, in some cases 10-20 nm thick, such as 15 nm), subjected to an EUV exposure dose and post-exposure bake, and then dry developed. The process conditions for the dry development may be, for example: reactant flow of 100-500 sccm (e.g., 500 sccm HBr or HCl), temperature of −10 to 120° C. (e.g., −10° C.), pressure of 20-500 mT (e.g., 300 mT) with no plasma and for a time of about 10-500 seconds, in some cases about 10 sec to 1 min, dependent on the photoresist film and composition and properties. Where the hydrogen halide reactant flows are of hydrogen gas and halide gas, a remote plasma/UV radiation is used to generate radicals from the $H_2$ and $Cl_2$ and/or $Br_2$, and the hydrogen and halide radicals are flowed to the reaction chamber to contact the patterned EUV photoresist on the substrate layer of the wafer. Suitable plasma power may range from 100 to 500 W, with no bias. It should be understood that while these conditions are suitable for some processing reactors, e.g., a Kiyo etch tool available from Lam Research Corporation, Fremont, CA, a wider range of process conditions may be used according to the capabilities of the processing reactor.

Another potential advantage of the gradient films is apparent in the development. As discussed earlier, as the EUV light travels through a resist, some of the light is absorbed. This means that the bottom of the resist is exposed to less light than the top of the resist. Through the use of gradient films, a more uniform distribution of the number of EUV photons that are absorbed throughout the resist thickness may be achieved, while retaining sufficient EUV-inducible reactivity required for selective development. For example, in the case of the isopropyltris(dimethylamino)tin and tetrakis(dimethylamino)tin, regions deposited with relatively higher ratios of tetrakis(dimethylamino)tin:isopropyltris(dimethylamino)tin may have lower Sn-alkyl bond percentage and more Sn—O—Sn bonds, as compared to regions deposited with relatively lower ratios of tetrakis(dimethylamino)tin:isopropyltris(dimethylamino)tin. Thus, if a larger tetrakis(dimethylamino)tin amount is flowed initially during deposition (and then decreased during deposition), the bottom of the film may be effectively more cross-linked than the top of the film.

Conclusion

With introduction of high-EUV-absorbing elements, photoresist materials can absorb more EUV photons and emit more secondary electrons relative to conventional metal oxides photoresist such as Inpria, which can bring down the dose requirement and thus cost for EUV lithography. Such film can potentially be deposited using both wet spin-coat methods and dry CVD/ALD methods.

Graded films may offer advantages to reduce the required EUV dose necessary for film exposure over homogeneous films. The dry deposition of these films offers more opportunities to tune the composition of the resists across the film thickness over spin-coated films.

Apparatus

Figure 3:
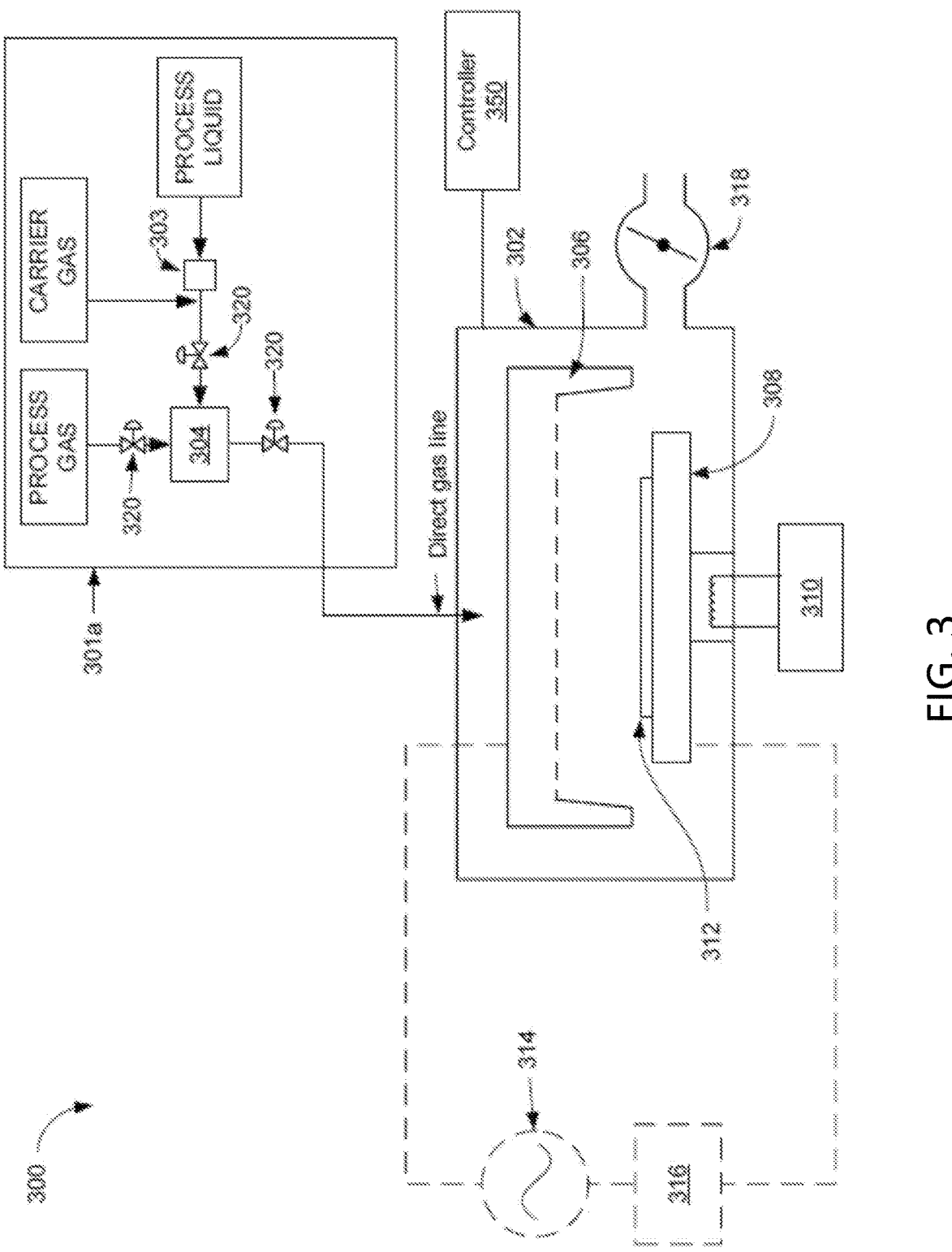
FIG. 3 illustrates a reaction chamber that may be used to deposit resist film according to various embodiments.
Figure 4:
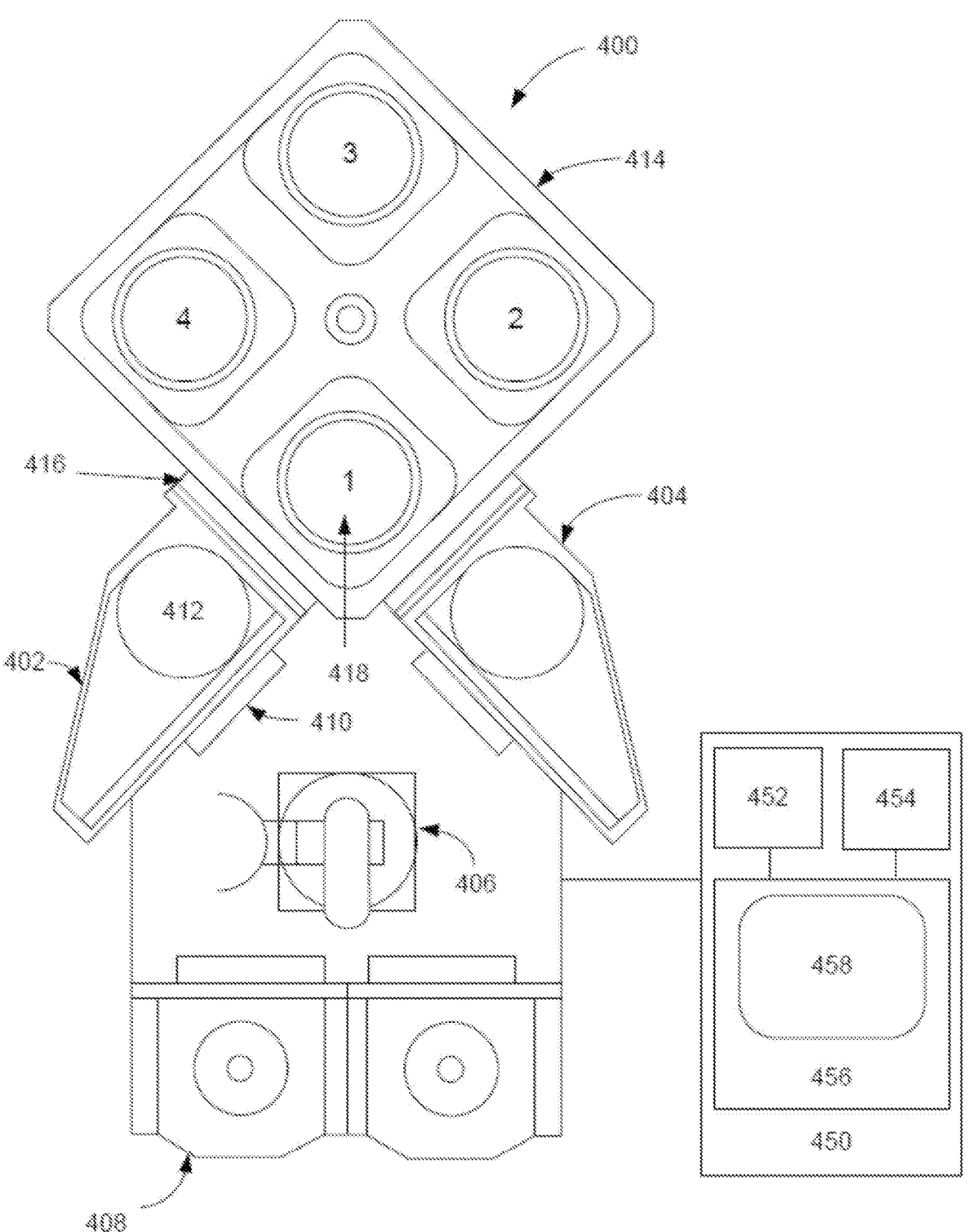
FIG. 4 depicts a multi-station reaction chamber that may be used to deposit resist film according to various embodiments.

FIG. 3 depicts a schematic illustration of an embodiment of process station 300 having a process chamber body 302 for maintaining a low-pressure environment that is suitable for implementation of described dry deposition and development embodiments as described herein. A plurality of process stations 300 may be included in a common low pressure process tool environment. For example, FIG. 4 depicts an embodiment of a multi-station processing tool 400, such as a VECTOR® processing tool available from Lam Research Corporation, Fremont, CA. In some embodiments, one or more hardware parameters of the process station 300 including those discussed in detail below may be adjusted programmatically by one or more computer controllers 350.

A process station may be configured as a module in a cluster tool. FIG. 6 depicts a semiconductor process cluster tool architecture with vacuum-integrated deposition and patterning modules suitable for implementation of the embodiments described herein. Such a cluster process tool architecture can include resist deposition, resist exposure (EUV scanner), resist dry development and etch modules, as described above and further below with reference to FIGS. 5 and 6.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 3, process station 300 fluidly communicates with reactant delivery system 301a for delivering process gases to a distribution showerhead 306. Reactant delivery system 301a optionally includes a mixing vessel 304 for blending and/or conditioning process gases, for delivery to showerhead 306. One or more mixing vessel inlet valves 320 may control introduction of process gases to mixing vessel 304. In various embodiments, mixing vessel 304 may be omitted, and the reactant delivery system 301a may be configured to deliver each of the reactants to the process station 300 separately, such that they do not mix before reaching the process station 300. Where plasma exposure is used, plasma may also be delivered to the showerhead 306 or may be generated in the process station 300. As noted above, in at least some embodiments, non-plasma thermal exposure is favored.

FIG. 3 includes an optional vaporization point 303 for vaporizing liquid reactant to be supplied to the mixing vessel 304. In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape, and may have any suitable number and arrangement of ports for distributing process gases to substrate 312.

In some embodiments, pedestal 308 may be raised or lowered to expose substrate 312 to a volume between the substrate 312 and the showerhead 306. It will be appreciated that, in some embodiments, pedestal height may be adjusted programmatically by a suitable computer controller 350.

In some embodiments, pedestal 308 may be temperature controlled via heater 310. In some embodiments, the pedestal 308 may be heated to a temperature of greater than 0° C. and up to 300° C. or more, for example 50 to 120° C., such as about 65 to 80° C., during non-plasma thermal exposure of a photopatterned resist to hydrogen halide dry development chemistry, such as HBr or HCl, as described in disclosed embodiments.

Further, in some embodiments, pressure control for process station 300 may be provided by a butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to the process station 300.

In some embodiments, a position of showerhead 306 may be adjusted relative to pedestal 308 to vary a volume between the substrate 312 and the showerhead 306. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

Where plasma may be used, for example in gentle plasma-based dry development embodiments and/or etch operations conducted in the same chamber, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are up to about 500 W.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of an dry development chemistry reactant gas, such as HBr or HCl, and time delay instructions for the recipe phase. In some embodiments, the controller 350 may include any of the features described below with respect to system controller 450 of FIG. 4.

As described above, one or more process stations may be included in a multi-station processing tool. FIG. 4 shows a schematic view of an embodiment of a multi-station processing tool 400 with an inbound load lock 402 and an outbound load lock 404, either or both of which may include a remote plasma source. A robot 406 at atmospheric pressure is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment to treat the silicon nitride surface in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 includes four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 414 may include one or more matched pairs of dry development and etch process stations. Also, in some embodiments, for depositing a EUV resist film with a vertically graded composition, a multi-station processing tool may be configured to deposit a series (e.g., four) sequential homogeneous stepped absorption layer, thereby increasing the density of atoms with high EUV absorptivity at the bottom of the film relative to the top of the film. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog, and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 400. System control software 458 may be config-
ured in any suitable way. For example, various process tool
component subroutines or control objects may be written to
control operation of the process tool components used to
carry out various process tool processes. System control
software 458 may be coded in any suitable computer read-
able programming language.

In some embodiments, system control software 458 may
include input/output control (IOC) sequencing instructions
for controlling the various parameters described above.
Other computer software and/or programs stored on mass
storage device 454 and/or memory device 456 associated
with system controller 450 may be employed in some
embodiments. Examples of programs or sections of pro-
grams for this purpose include a substrate positioning pro-
gram, a process gas control program, a pressure control
program, a heater control program, and a plasma control
program.

A substrate positioning program may include program
code for process tool components that are used to load the
substrate onto pedestal 418 and to control the spacing
between the substrate and other parts of process tool 400.

A process gas control program may include code for
controlling hydrogen halide gas composition (e.g., HBr or
HCl gas as described herein) and flow rates and optionally
for flowing gas into one or more process stations prior to
deposition in order to stabilize the pressure in the process
station. A pressure control program may include code for
controlling the pressure in the process station by regulating,
for example, a throttle valve in the exhaust system of the
process station, a gas flow into the process station, etc.

A heater control program may include code for control-
ling the current to a heating unit that is used to heat the
substrate. Alternatively, the heater control program may
control delivery of a heat transfer gas (such as helium) to the
substrate.

A plasma control program may include code for setting
RF power levels applied to the process electrodes in one or
more process stations in accordance with the embodiments
herein.

A pressure control program may include code for main-
taining the pressure in the reaction chamber in accordance
with the embodiments herein.

In some embodiments, there may be a user interface
associated with system controller 450. The user interface
may include a display screen, graphical software displays of
the apparatus and/or process conditions, and user input
devices such as pointing devices, keyboards, touch screens,
microphones, etc.

In some embodiments, parameters adjusted by system
controller 450 may relate to process conditions. Non-limit-
ing examples include process gas composition and flow
rates, temperature, pressure, plasma conditions (such as RF
bias power levels), etc. These parameters may be provided
to the user in the form of a recipe, which may be entered
utilizing the user interface.

Signals for monitoring the process may be provided by
analog and/or digital input connections of system controller
450 from various process tool sensors. The signals for
controlling the process may be output on the analog and
digital output connections of process tool 400. Non-limiting
examples of process tool sensors that may be monitored
include mass flow controllers, pressure sensors (such as
manometers), thermocouples, etc. Appropriately pro-
grammed feedback and control algorithms may be used with
data from these sensors to maintain process conditions.

System controller 450 may provide program instructions
for implementing the above-described deposition processes.
The program instructions may control a variety of process
parameters, such as DC power level, RF bias power level,
pressure, temperature, etc. The instructions may control the
parameters to operate dry development and/or etch pro-
cesses according to various embodiments described herein.

The system controller 450 will typically include one or
more memory devices and one or more processors config-
ured to execute the instructions so that the apparatus will
perform a method in accordance with disclosed embodi-
ments. Machine-readable media containing instructions for
controlling process operations in accordance with disclosed
embodiments may be coupled to the system controller 450.

In some implementations, the system controller 450 is
part of a system, which may be part of the above-described
examples. Such systems can include semiconductor process-
ing equipment, including a processing tool or tools, chamber
or chambers, a platform or platforms for processing, and/or
specific processing components (a wafer pedestal, a gas flow
system, etc.). These systems may be integrated with elec-
tronics for controlling their operation before, during, and
after processing of a semiconductor wafer or substrate. The
electronics may be referred to as the "controller," which may
control various components or subparts of the system or
systems. The system controller 450, depending on the pro-
cessing conditions and/or the type of system, may be pro-
grammed to control any of the processes disclosed herein,
including the delivery of processing gases, temperature
settings (e.g., heating and/or cooling), pressure settings,
vacuum settings, power settings, radio frequency (RF) gen-
erator settings, RF matching circuit settings, frequency
settings, flow rate settings, fluid delivery settings, positional
and operation settings, wafer transfers into and out of a tool
and other transfer tools and/or load locks connected to or
interfaced with a specific system.

Broadly speaking, the system controller 450 may be
defined as electronics having various integrated circuits,
logic, memory, and/or software that receive instructions,
issue instructions, control operation, enable cleaning opera-
tions, enable endpoint measurements, and the like. The
integrated circuits may include chips in the form of firmware
that store program instructions, digital signal processors
(DSPs), chips defined as application specific integrated
circuits (ASICs), and/or one or more microprocessors, or
microcontrollers that execute program instructions (e.g.,
software). Program instructions may be instructions com-
municated to the system controller 450 in the form of
various individual settings (or program files), defining
operational parameters for carrying out a particular process
on or for a semiconductor wafer or to a system. The
operational parameters may, in some embodiments, be part
of a recipe defined by process engineers to accomplish one
or more processing steps during the fabrication of one or
more layers, materials, metals, oxides, silicon, silicon diox-
ide, surfaces, circuits, and/or dies of a wafer.

The system controller 450, in some implementations, may
be a part of or coupled to a computer that is integrated with,
coupled to the system, otherwise networked to the system, or
a combination thereof. For example, the system controller
450 may be in the "cloud" or all or a part of a fab host
computer system, which can allow for remote access of the
wafer processing. The computer may enable remote access
to the system to monitor current progress of fabrication
operations, examine a history of past fabrication operations,
examine trends or performance metrics from a plurality of
fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 5:
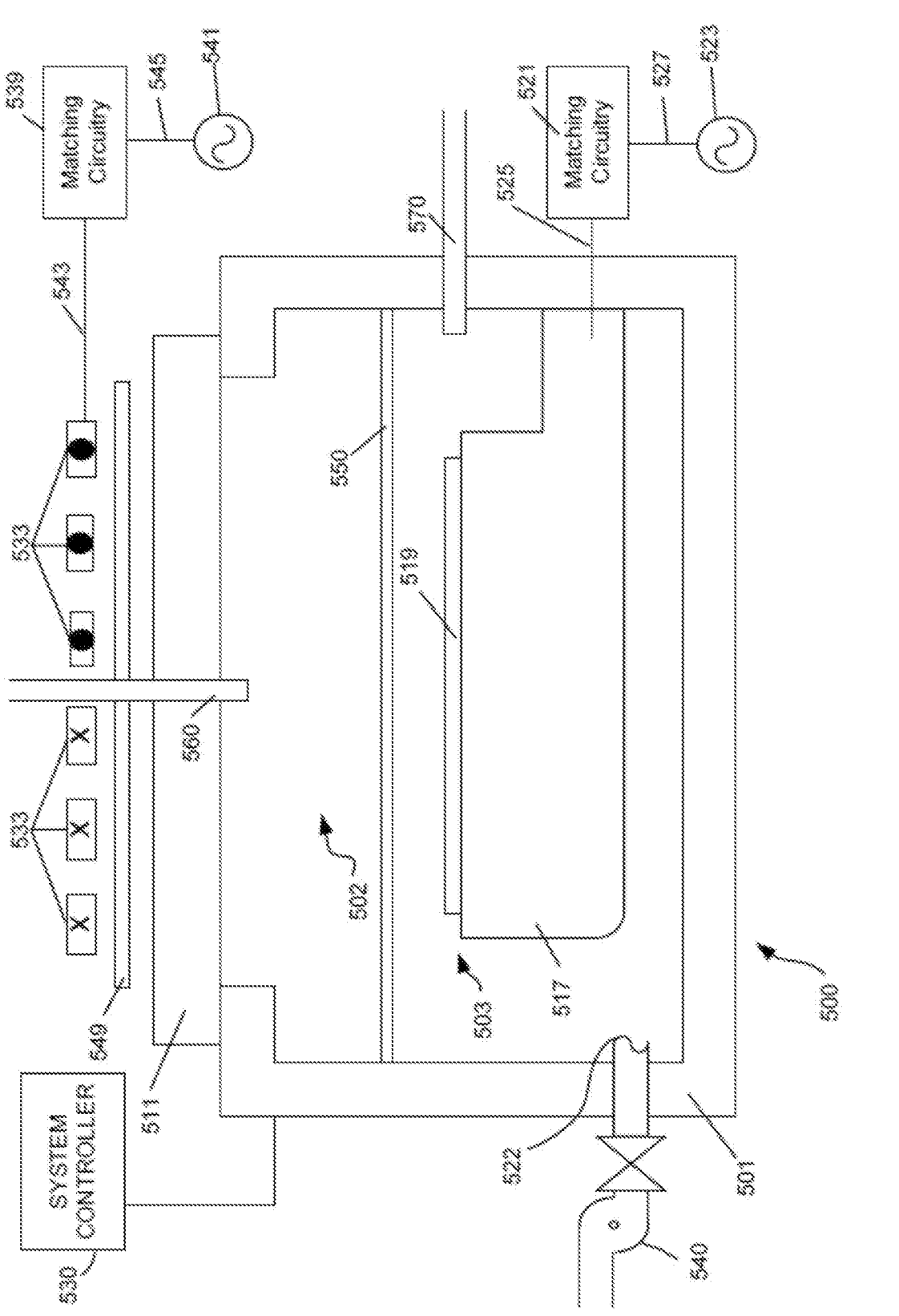
FIG. 5 shows a reaction chamber that may be used for various purposes such as dry development of resist film, and/or etching, according to various embodiments.
Figure 6:
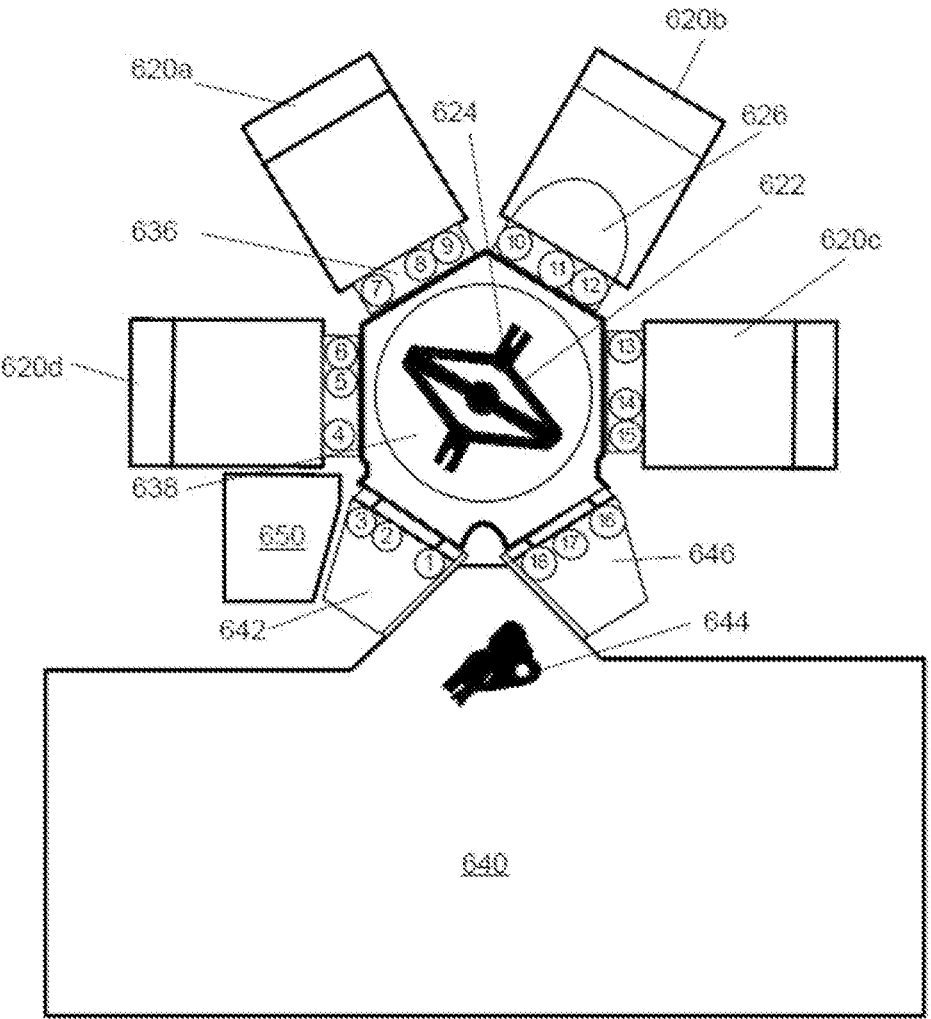
FIG. 6 illustrates a semiconductor process cluster tool architecture with vacuum-integrated deposition and patterning modules suitable for implementation of various embodiments herein.

FIG. 5 schematically shows a cross-sectional view of an inductively coupled plasma apparatus 500 appropriate for implementing certain embodiments or aspects of embodiments such as dry development and/or etch, an example of which is a Kiyo® reactor, produced by Lam Research Corp. of Fremont, CA. In other embodiments, other tools or tool types having the functionality to conduct the dry development and/or etch processes described herein may be used for implementation.

The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber into an upper sub-chamber 502 and a lower sub chamber 503. In most embodiments, plasma grid 550 may be removed, thereby utilizing a chamber space made of sub chambers 502 and 503. A chuck 517 is positioned within the lower sub-chamber 503 near the bottom inner surface. The chuck 517 is configured to receive and hold a semiconductor wafer 519 upon which the etching and deposition processes are performed. The chuck 517 can be an electrostatic chuck for supporting the wafer 519 when present. In some embodiments, an edge ring (not shown) surrounds chuck 517, and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross sections of coil 533 are shown with symbols, and coils having an "X" extend rotationally into the page, while coils having a "•" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549*a* is positioned between the coil 533 and the window 511. The Faraday shield 549*a* may be maintained in a spaced apart relationship relative to the coil 533. In some embodiments, the Faraday shield 549*a* is disposed immediately above the window 511. In some embodiments, the Faraday shield 549*b* is between the window 511 and the chuck 517. In some embodiments, the Faraday shield 549*b* is not maintained in a spaced apart relationship relative to the coil 533. For example, the Faraday shield 549*b* may be directly below the window 511 without a gap. The coil 533, the Faraday shield 549*a*, and the window 511 are each configured to be substantially parallel to one another. The Faraday shield 549*a* may prevent metal or other species from depositing on the window 511 of the process chamber 524.

Process gases may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 524 and to maintain a pressure within the process chamber 524. For example, the vacuum pump may be used to evacuate the lower sub-chamber 503 during a purge operation of ALD. A valve-controlled conduit may be used to fluidically connect the vacuum pump to the process chamber 524 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549a and/or optional grid 550 may include internal channels and holes that allow delivery of process gases to the process chamber 524. Either or both of Faraday shield 549a and optional grid 550 may serve as a showerhead for delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and selectively deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 6 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 6 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 638 interfaces with four processing modules 620a-620d, which may be individually optimized to perform various fabrication processes. By way of example, processing modules 620a-620d may be implemented to perform deposition, evaporation, ELD, dry development, etch, strip, and/or other semiconductor processes. For example, module 620a may be an ALD reactor that may be operated to perform in a non-plasma, thermal atomic layer depositions as described herein, such as Vector tool, available from Lam Research Corporation, Fremont, CA. And module 620b may be a PECVD tool, such as the Lam Vector®. It should be understood that the figure is not necessarily drawn to scale.

Airlocks 642 and 646, also known as a loadlocks or transfer modules, interface with the VTM 638 and a patterning module 640. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 6 but without the integrated patterning module.

Airlock 642 may be an "outgoing" loadlock, referring to the transfer of a substrate out from the VTM 638 serving a deposition module 620a to the patterning module 640, and airlock 646 may be an "ingoing" loadlock, referring to the transfer of a substrate from the patterning module 640 back in to the VTM 638. The ingoing loadlock 646 may also provide an interface to the exterior of the tool for access and egress of substrates. Each process module has a facet that interfaces the module to VTM 638. For example, deposition process module 620a has facet 636. Inside each facet, sensors, for example, sensors 1-18 as shown, are used to detect the passing of wafer 626 when moved between respective stations. Patterning module 640 and airlocks 642 and 646 may be similarly equipped with additional facets and sensors, not shown.

Main VTM robot 622 transfers wafer 626 between modules, including airlocks 642 and 646. In one embodiment, robot 622 has one arm, and in another embodiment, robot 622 has two arms, where each arm has an end effector 624 to pick wafers such as wafer 626 for transport. Front-end robot 644, in is used to transfer wafers 626 from outgoing airlock 642 into the patterning module 640, from the patterning module 640 into ingoing airlock 646. Front-end robot 644 may also transport wafers 626 between the ingoing loadlock and the exterior of the tool for access and egress of substrates. Because ingoing airlock module 646 has the ability to match the environment between atmospheric and vacuum, the wafer 626 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 642 may provide this function by holding the transferred wafers at a lower pressure, no higher than the pressure in the patterning module 640, for a period of time and exhausting any off-gassing, so that the optics of the patterning tool 640 are not contaminated by off-gassing from the substrate. A suitable pressure for the outgoing, off-gassing airlock is no more than 1E-8 Torr.

In some embodiments, a system controller 650 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 3, 4 or 5 may be implemented with the tool in FIG. 6.

CONCLUSION

Process and apparatus for dry development of metal and/or metal oxide photoresists, for example to form a patterning mask in the context of EUV patterning is disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

The following sample claims are provided for further illustration of certain embodiments of the disclosure. The disclosure is not necessarily limited to these embodiments.

What is claimed is:

1. A method of depositing a metal oxide-containing photoresist material on a substrate, the method comprising:
   flowing a first organometallic precursor and a second organometallic precursor into a reaction chamber with a counter-reactant,
      wherein the first organometallic precursor comprises a metal having a high EUV-absorption cross-section, a first organic group with metal-carbon bond that survives a vapor phase deposition reaction with the counter-reactant, and a first ligand that reacts with the counter-reactant; and
      wherein the second organometallic precursor includes no organic group with a metal-carbon bond and a second ligand that reacts with the counter-reactant; and
   varying the ratio of the first organometallic precursor and the second organometallic precursor during the deposition such that the metal oxide-containing photoresist material comprises a vertical composition gradient along a thickness of the metal oxide-containing photoresist material.

2. A method of depositing a metal oxide-containing photoresist material on a substrate, the method comprising:
   flowing a first organometallic precursor and a second organometallic precursor into a reaction chamber with a counter-reactant,
      wherein the first organometallic precursor comprises a metal having a high EUV-absorption cross-section, a first organic group with metal-carbon bond that survives a vapor phase deposition reaction with the counter-reactant, and a first ligand that reacts with the counter-reactant; and
      wherein the second organometallic precursor includes a second organic group with metal-carbon bond with metal-carbon bond that survives a vapor phase deposition reaction with the counter-reactant and a second ligand that reacts with the counter-reactant; and
   varying the ratio of the first organometallic precursor and second organometallic precursor during the deposition such that the metal oxide-containing photoresist material comprises a vertical composition gradient along a thickness of the metal oxide-containing photoresist material.

3. The method of claim 1, wherein the ratio is varied such that the bottom of the film is more cross-linked than the top of the film.

4. The method of claim 1, wherein each of the first organometallic precursor and the second organometallic precursor comprises tin (Sn).

5. The method of claim 1, wherein the first organic group is an alkyl.

6. The method of claim 1, wherein the first ligand comprises an amine.

7. The method of claim 1, wherein the ratio of the second organometallic precursor to the first organometallic precursor decreases as the film grows.

8. The method of claim 1, wherein the first organometallic precursor is isopropyl tris(dimethylamino)tin.

9. The method of claim 1, wherein the second organometallic precursor is tetrakis(dimethylamino)tin.

10. The method of claim 2, wherein each of the first organometallic precursor and the second organometallic precursor comprises tin (Sn).

11. The method of claim 2, wherein the ratio of the second organometallic precursor to the first organometallic precursor decreases as the film grows.

12. The method of claim 2, wherein at least one of the first ligand and second ligand comprises an amine.

13. The method of claim 2, wherein the ratio is varied such that the bottom of the film is more cross-linked than the top of the film.

14. The method of claim 2, wherein the first organometallic precursor is isopropyl tris(dimethylamino)tin.

15. The method of claim 2, wherein the second organometallic precursor is tert-butyl tris(dimethylamino)tin.

16. A metal oxide-containing photoresist film comprising a vertical composition gradient along a thickness of the film, the vertical composition gradient comprising a first composition and a second composition, wherein the first composition comprises a metal having a high EUV-absorption cross-section, and is crosslinked with metal-oxide bonds, a first organic group having metal-carbon bond;

wherein the second composition comprises the metal having a high EUV-absorption cross-section and more crosslinked with metal-oxide bonds than the first composition; and wherein the vertical gradient is such that the ratio of the second composition to the first composition is higher at the bottom than at the top of the film.

17. The film of claim 16, wherein the metal is tin (Sn).

18. The film of claim 16, wherein the first organic group in the first composition is isopropyl and the second composition has no organic ligand with metal-carbon bond.

19. The film of claim 16, wherein the first organic group in the first composition is isopropyl, and the second composition further comprises an organic group with metal-carbon bond that is t-butyl.

20. The method of claim 1, wherein the first organometallic precursor and the second organometallic precursor are provided to the reaction chamber concurrently.

* * * * *